United States Patent
Miyairi

(10) Patent No.: US 9,859,439 B2
(45) Date of Patent: Jan. 2, 2018

(54) SEMICONDUCTOR DEVICE AND METHOD FOR MANUFACTURING THE SAME

(71) Applicant: SEMICONDUCTOR ENERGY LABORATORY CO., LTD., Atsugi-shi, Kanagawa-ken (JP)

(72) Inventor: Hidekazu Miyairi, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 14/484,408

(22) Filed: Sep. 12, 2014

(65) Prior Publication Data
US 2015/0076495 A1    Mar. 19, 2015

(30) Foreign Application Priority Data

Sep. 18, 2013  (JP) ................................. 2013-193292

(51) Int. Cl.
*H01L 27/24* (2006.01)
*G11C 13/00* (2006.01)
(Continued)

(52) U.S. Cl.
CPC .... *H01L 29/7869* (2013.01); *H01L 29/66969* (2013.01); *H01L 29/78642* (2013.01); *H01L 21/02565* (2013.01); *H01L 21/02667* (2013.01)

(58) Field of Classification Search
CPC ..... H01L 29/7869; H01L 21/16; H01L 21/00; H01L 29/24; H01L 21/479;
(Continued)

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Marcos D Pizarro
*Assistant Examiner* — Long H Le
(74) *Attorney, Agent, or Firm* — Nixon Peabody LLP; Jeffrey L. Costellia

(57) ABSTRACT

To provide a transistor having highly stable electric characteristics and also a miniaturized structure. Further, also high performance and high reliability of a semiconductor device including the transistor can be achieved. The transistor is a vertical transistor in which a first electrode having an opening, an oxide semiconductor layer, and a second electrode are stacked in this order, a gate insulating layer is provided in contact with side surfaces of the first electrode, the oxide semiconductor layer, and the second electrode, and a ring-shaped gate electrode facing the side surfaces of the first electrode, the oxide semiconductor layer, and the second electrode with the gate insulating layer interposed therebetween is provided. In the opening in the first electrode, an insulating layer in contact with the oxide semiconductor layer is embedded.

25 Claims, 14 Drawing Sheets

(51) Int. Cl.
  *H01L 45/00* (2006.01)
  *H01L 29/786* (2006.01)
  *H01L 29/66* (2006.01)
  *H01L 21/02* (2006.01)

(58) Field of Classification Search
  CPC ......... H01L 29/66969; H01L 29/78642; H01L 21/02565; H01L 21/02667
  See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,367,489 B2 | 2/2013 | Yamazaki |
| 8,390,044 B2 | 3/2013 | Kawae et al. |
| 8,598,635 B2 | 12/2013 | Yamazaki |
| 8,637,861 B2 | 1/2014 | Yamazaki et al. |
| 8,704,218 B2 | 4/2014 | Yamazaki |
| 8,748,880 B2 | 6/2014 | Yamazaki et al. |
| 8,772,771 B2 | 7/2014 | Tanaka |
| 8,823,082 B2 | 9/2014 | Yanagisawa |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0139824 A1* | 6/2005 | Park .................... H01L 27/3262 257/40 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0032665 A1* | 2/2010 | Yamazaki ......... H01L 29/78618 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0031491 A1* | 2/2011 | Yamazaki ......... G02F 1/136227 257/43 |
| 2011/0101338 A1* | 5/2011 | Yamazaki ........... H01L 27/1225 257/43 |
| 2011/0101355 A1 | 5/2011 | Yamazaki |
| 2011/0127526 A1* | 6/2011 | Kawae ............ H01L 29/78606 257/43 |
| 2011/0233555 A1 | 9/2011 | Endo |
| 2011/0250723 A1* | 10/2011 | Suzawa ............ G11C 16/0433 438/151 |
| 2012/0061664 A1* | 3/2012 | Yamazaki ........... H01L 27/1225 257/43 |
| 2012/0199842 A1 | 8/2012 | Takemura |
| 2012/0213000 A1 | 8/2012 | Takemura |
| 2012/0228688 A1 | 9/2012 | Matsubayashi |
| 2013/0015436 A1 | 1/2013 | Yamazaki |
| 2013/0221356 A1 | 8/2013 | Yamazaki et al. |
| 2013/0228839 A1 | 9/2013 | Arai |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |

(56) References Cited

FOREIGN PATENT DOCUMENTS

| JP | 2003-086000 A | 3/2003 |
|---|---|---|
| JP | 2003-086808 A | 3/2003 |
| JP | 2003-101012 | 4/2003 |
| JP | 2004-103957 A | 4/2004 |
| JP | 2004-273614 A | 9/2004 |
| JP | 2004-273732 A | 9/2004 |
| JP | 2011-181801 | 9/2011 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H. et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '09 : SID International Symposium of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp.983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Nl, Cu, or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, Vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In, QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

SEMICONDUCTOR DEVICE AND METHOD FOR MANUFACTURING THE SAME

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a memory device, a driving method thereof, or a manufacturing method thereof. In particular, the present invention relates to a semiconductor device including an oxide semiconductor, and a method for manufacturing the semiconductor device.

In this specification, a semiconductor device generally means a device which can function by utilizing semiconductor characteristics. For example, a memory device, an electro-optical device, a semiconductor circuit, and an electronic device may include a semiconductor device.

2. Description of the Related Art

A technique by which transistors are formed using semiconductor thin films formed over a substrate having an insulating surface has been attracting attention. Such transistors are applied to a wide range of electronic devices such as an integrated circuit (IC) and an image display device (display device).

A silicon-based semiconductor material is widely known as a material for a semiconductor thin film applicable to a transistor. As another material, an oxide semiconductor has been attracting attention.

For example, a transistor including a semiconductor layer formed using an oxide containing indium (In), gallium (Ga), and zinc (Zn) (an In—Ga—Zn-based oxide) is disclosed (e.g., see Patent Document 1).

Further, in particular, for a highly integrated electronic device with high performance, a transistor is required to be miniaturized, and a vertical transistor structure in which reduction in an area occupied by the transistor is achieved has been proposed (e.g., see Patent Document 2).

REFERENCE

Patent Document

[Patent Document 1] Japanese Published Patent Application No. 2011-181801
[Patent Document 2] Japanese Published Patent Application No. 2003-101012

SUMMARY OF THE INVENTION

However, the miniaturization of a transistor causes a reduction in the channel length, which might lead to a problem of deterioration in electrical characteristics of the transistor, reduction in the threshold voltage, and the like.

In addition, when the channel length is reduced, the amount of off-state current is increased while the amount of on-state current of the transistor is increased.

With use of an oxide semiconductor layer, the amount of off-state current of the transistor can be reduced. However, when oxygen vacancies are included in the oxide semiconductor layer, the electrical characteristics of the transistor might deteriorate.

An object of one embodiment of the invention disclosed is to provide a transistor that can be miniaturized and has stable electrical characteristics. Alternatively, an object of one embodiment of the invention disclosed is to provide a transistor whose channel length is easily adjusted. Alternatively, an object of one embodiment of the invention disclosed is to provide a transistor with a large channel width. Further alternatively, an object of one embodiment of the invention disclosed is to provide a transistor whose amount of on-state current is large.

Another object of one embodiment of the present invention is to achieve high performance, high reliability, and high productivity also of a semiconductor device including the transistor. Alternatively, an object of one embodiment of the invention disclosed is to provide a semiconductor device to which oxygen is easily supplied. Another object is to provide a novel semiconductor device. Note that the descriptions of these objects do not disturb the existence of other objects. Note that one embodiment of the present invention does not necessarily achieve all the objects listed above. Other objects will be apparent from and can be derived from the description of the specification, the drawings, the claims, and the like.

A transistor provided in the semiconductor device is a vertical transistor including the following components: a first electrode, an oxide semiconductor layer, and a second electrode, which are stacked in this order; a gate insulating layer that is in contact with side surfaces of the first electrode, the oxide semiconductor layer, and the second electrode; a ring-shaped gate electrode that covers the side surface of the oxide semiconductor layer with the gate insulating layer interposed therebetween.

In the transistor, the first electrode and the second electrode function as a source electrode or a drain electrode.

One of or both the first electrode and the second electrode have an opening reaching the oxide semiconductor layer, and an insulating layer containing oxygen is embedded in the opening and be in contact with the oxide semiconductor layer (i.e., the opening is filled with the insulating layer).

Note that when "one layer is embedded in an opening" in this specification, a top surface of the embedded layer may be aligned with a top surface of a layer having the opening. Alternatively, the top surface of the embedded layer may be positioned higher than the top surface of the layer having the opening or may be positioned lower than the top surface of the layer having the opening.

One embodiment of the invention disclosed in this specification is a semiconductor device including a first electrode, an oxide semiconductor layer over the first electrode, a second electrode that is over the oxide semiconductor layer and overlaps with the first electrode, a gate insulating layer in contact with the first electrode, the oxide semiconductor layer, and the second electrode, and a gate electrode that covers a side surface of the oxide semiconductor layer with the gate insulating layer interposed therebetween. The first electrode has an opening in a region overlapping with the oxide semiconductor layer, and an insulating layer in contact with the oxide semiconductor layer is embedded in the opening.

In the above structure, the insulating layer preferably contains oxygen.

Another embodiment of the invention disclosed in this specification is a semiconductor device including a first electrode, an oxide semiconductor layer over the first electrode, a second electrode that is over the oxide semiconductor layer and overlaps with the first electrode, a first insulating layer over the second electrode, a gate insulating layer in contact with the first electrode, the oxide semiconductor layer, the second electrode, and the first insulating layer, and a gate electrode that covers a side surface of the oxide semiconductor layer with the gate insulating layer interposed therebetween. The first electrode has a first opening in a region overlapping with the oxide semiconductor layer, and in the first opening, a second insulating layer in contact with the oxide semiconductor layer is embedded.

In the structure, the second insulating layer preferably contains oxygen.

According to one embodiment of the invention disclosed in this specification, in the semiconductor device with the above structure, the second electrode has a second opening in a region overlapping with the oxide semiconductor layer, part of the oxide semiconductor layer is exposed through the second opening, and the first insulating layer is in contact with the part of the oxide semiconductor layer exposed through the second opening.

In the above structure, the first insulating layer is preferably an insulating layer containing oxygen.

According to one embodiment of the invention disclosed in this specification, in the semiconductor device with the above structure, the first electrode functions as one of a source electrode and a drain electrode, and the second electrode functions as the other of the source electrode and the drain electrode.

Another embodiment of the invention disclosed in this specification is an electronic device including a semiconductor device with any of the above structures.

Another embodiment of the invention disclosed in this specification is a method for manufacturing a semiconductor device including the following steps: a step of forming a first conductive film with an opening; a step of forming an insulating layer that is embedded in the opening; a step of forming an oxide semiconductor film in contact with the insulating layer over the first conductive film; a step of forming a second conductive film over the oxide semiconductor film; a step of processing the first conductive film, the oxide semiconductor film, and the second conductive film into island shapes, thereby forming a first electrode with the opening, an oxide semiconductor layer, and a second electrode; a step of forming an insulating film covering the first electrode, the oxide semiconductor layer, and the second electrode; a step of forming a third conductive film covering the insulating film; and a step of removing a part of the insulating film and a part of the third conductive film so as to expose the second electrode, thereby forming a gate insulating layer and a gate electrode that covers a side surface of the oxide semiconductor layer with the gate insulating layer interposed therebetween.

In the above manufacturing method, the part of the insulating film and the part of the third conductive film are preferably removed by CMP treatment.

Another embodiment of the invention disclosed in this specification is a method for manufacturing a semiconductor device including the following steps: a step of forming a first conductive film with a first opening; a step of forming an insulating layer that is embedded in the first opening; a step of forming an oxide semiconductor film in contact with the insulating layer over the first conductive film; a step of forming a second conductive film over the oxide semiconductor film; a step of forming a first insulating film over the second conductive film; a step of processing the first conductive film, the oxide semiconductor film, the second conductive film, and the first insulating film into island shapes, thereby forming a first electrode with the first opening, an oxide semiconductor layer, a second electrode, and a cap insulating layer; a step of forming a second insulating film and a third conductive film, the second insulating film covering the first electrode, the oxide semiconductor layer, the second electrode, and the cap insulating layer and the third conductive film covering the second insulating film; and a step of removing a part of the second insulating film and a part of the third conductive film so as to expose the cap insulating layer, thereby forming a gate insulating layer and a gate electrode that covers a side surface of the oxide semiconductor layer with the gate insulating layer interposed therebetween.

Another embodiment of the invention disclosed in this specification is a method for manufacturing a semiconductor device including a step of processing the second conductive film to have a second opening before forming the first insulating film, in addition to the above steps of the manufacturing method, where the first insulating film is formed to be in contact with a part of the oxide semiconductor film that is exposed through the second opening and the second electrode is formed to include the second opening.

In the above manufacturing method, the first insulating film preferably contains oxygen.

In the above manufacturing method, the part of the second insulating film and the part of the third conductive film are preferably removed by CMP treatment.

In the above manufacturing method, the insulating layer preferably contains oxygen.

In the above manufacturing method, the oxide semiconductor film is preferably subjected to heat treatment.

When a vertical transistor is used, the channel length of the transistor can be easily adjusted with the thickness of the oxide semiconductor layer even in a miniaturized structure. Furthermore, with a structure in which a side surface of an oxide semiconductor layer is surrounded by a ring-shaped gate electrode with a gate insulating film interposed therebetween, the effective channel width of the transistor can be made large. Accordingly, the amount of on-state current of the transistor can be increased.

Furthermore, when one of or both the first electrode and the second electrode have an opening and an insulating layer containing oxygen is embedded in the opening and be in contact with the oxide semiconductor layer, oxygen can be supplied to the oxide semiconductor layer. Oxygen vacancies in the oxide semiconductor layer are filled with supplied oxygen, whereby the reliability of a transistor using the oxide semiconductor layer can be increased.

According to the above features, a transistor with high and stable electrical characteristics can be provided even when the transistor has a miniaturized structure.

Furthermore, also in a semiconductor device including the transistor, high performance, high reliability, and high productivity can be achieved. Alternatively, a novel semiconductor device can be provided. Note that the description of these effects does not disturb the existence of other effects. One embodiment of the present invention does not necessarily achieve all the objects listed above. Other effects will be apparent from and can be derived from the description of the specification, the drawings, the claims, and the like.

DETAILED DESCRIPTION OF THE INVENTION

Figure 1A:
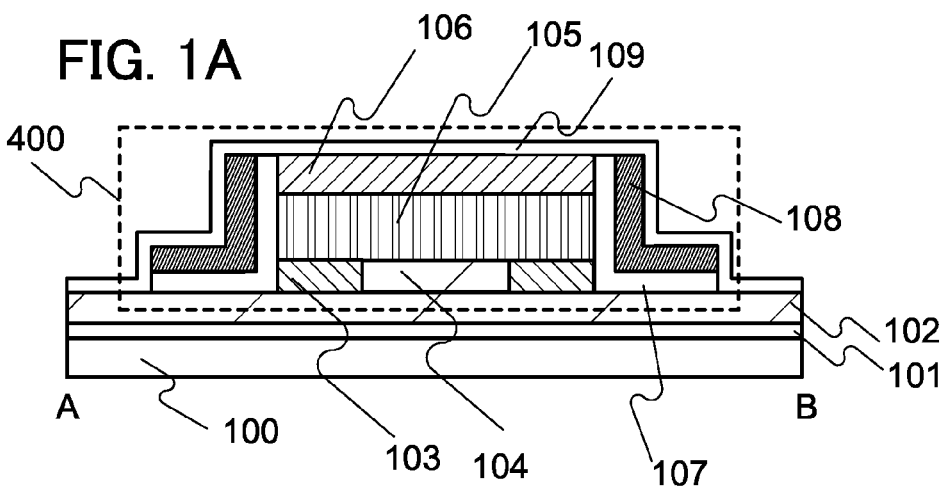
FIGS. 1A to 1D are a cross-sectional view and top views illustrating one embodiment of a semiconductor device.

Embodiments of the present invention will be described below in detail with reference to the drawings. However, the present invention is not limited to the description below, and it is easily understood by those skilled in the art that modes and details can be changed variously. Further, the present invention is not construed as being limited to description of the embodiments and the examples.

Note that the functions of a "source" and a "drain" may replace each other in the case, where transistors of opposite polarities are used, or in the case where the direction of a current flow changes in a circuit operation, for example. Thus, the terms "source" and "drain" can replace each other in this specification.

The term "electrically connected" includes the case where components are connected through an "object having any electric function". There is no particular limitation on the "object having any electric function" as long as electric signals can be transmitted and received between the components connected through the object.

The position, size, range, or the like of each component illustrated in drawings and the like is not accurately represented in some cases for easy understanding. Therefore, the disclosed invention is not necessarily limited to the position, the size, the range, or the like disclosed in the drawings and the like.

The ordinal number such as "first", "second", and "third" are used to avoid confusion among components.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, the term "substantially perpendicular" indicates that an angle formed between two straight lines is from 80° to 100°, and accordingly also includes the case where the angle is from 85° to 95°.

In this specification, trigonal and rhombohedral crystal systems are included in a hexagonal crystal system.

(Embodiment 1)

In this embodiment, one embodiment of a semiconductor device and a method for manufacturing the semiconductor device will be described with reference to FIGS. 1A to 1D, FIGS. 2A to 2F, FIGS. 3A to 3D, and FIGS. 4A to 4C.

<Example of Structure of Semiconductor Device>

FIG. 1A illustrates an example of a semiconductor device including a transistor 400. The transistor 400 is a vertical transistor that is similar to the above transistor, in which a first electrode 103, an oxide semiconductor layer 105, and a second electrode 106 are stacked in this order, a gate insulating layer 107 is provided to be in contact with side surfaces of the first electrode 103, the oxide semiconductor layer 105, and the second electrode 106, and a ring-shaped gate electrode 108 is provided to cover the side surface of the oxide semiconductor layer 105 with the gate insulating layer 107 interposed therebetween.

Therefore, in the oxide semiconductor layer of the transistor 400, a channel length direction is the up and down direction in the drawing, that is, a direction substantially orthogonal to a surface of the first electrode 103.

The first electrode 103 has a ring shape, and in an opening of the first electrode 103, an insulating layer 104 is embedded. The insulating layer 104 is in contact with the oxide semiconductor layer 105.

The insulating layer 104 is an insulating layer containing oxygen, such as a silicon oxide film or a silicon oxynitride film.

In the semiconductor device illustrated in FIG. 1A, the transistor 400 is provided over a substrate 100. Over the substrate 100, a barrier film 101 and an insulating film 102 are stacked. The insulating film 102 is an insulating layer containing oxygen, such as a silicon oxide film or a silicon oxynitride film. Furthermore, a barrier film 109 is provided to cover the transistor 400.

Note that as the insulating film 102 and the insulating layer 104, an insulating layer containing excessive oxygen (containing oxygen in excess of stoichiometric composition) is preferably used. When such an insulating layer containing excess oxygen is provided in contact with the oxide semiconductor layer 105, oxygen vacancies in the oxide semiconductor layer 105 are compensated, and the oxide semiconductor layer 105 can be made to be supersaturated with oxygen.

As the barrier film 101 and the barrier film 109, an insulating film having barrier properties against oxygen and hydrogen is preferably used. Examples of such an insulating film can include an aluminum oxide film. When such a material is used, the barrier film 101 and the barrier film 109 have a function of suppressing a release of oxygen from the oxide semiconductor layer 105 and diffusion of oxygen to portions other than the oxide semiconductor layer 105 from the insulating film 102 and the insulating layer 104, and also have a function of preventing entry of impurities such as hydrogen from the outside.

The insulating film containing excess oxygen is provided in contact with the oxide semiconductor layer and surrounded by the barrier films, whereby the composition of the oxide semiconductor layer can be almost the same as the stoichiometric composition or in a supersaturated state containing more oxygen than the stoichiometric composition. It is also possible to prevent entry of impurities such as hydrogen into the oxide semiconductor layer.

Figure 1B:
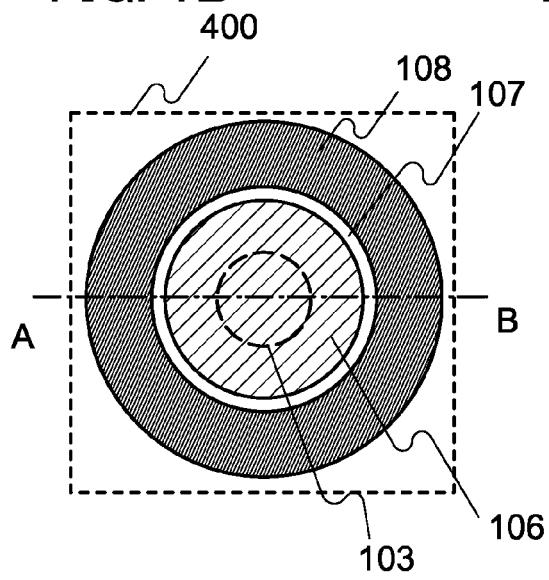
Figure 1C:
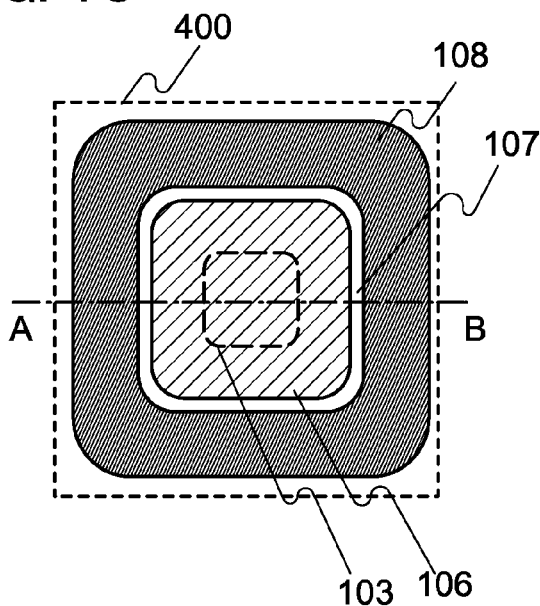
Figure 1D:
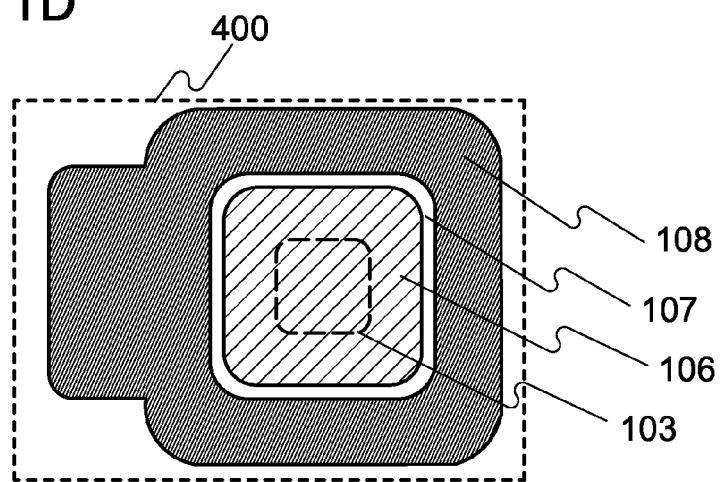

There is no particular limitation on the shape of the gate electrode as long as it is a ring form. FIGS. 1B and 1C each illustrate an example of a top view of the transistor 400. Note that FIG. 1A is a cross-sectional view along dashed-dotted line A-B in FIGS. 1B and 1C. FIG. 1D is a top view illustrating a modification example of the transistor 400. For simplicity, some films are not illustrated in FIGS. 1B to 1D.

The shape of the gate electrode 108 seen from the above may be a circular ring as shown in FIG. 1B or a polygonal ring as shown in FIG. 1C. The gate electrode 108 is not limited to the ring shape and may be a U-like shape or an L-like shape. Alternatively, part of the gate electrode 108 may be projected as shown in FIG. 1D. When part of the gate electrode is projected as shown in FIG. 1D, a portion in contact with a wiring or the like can be easily formed even in the case where a transistor has a miniaturized structure.

<Example of Method for Manufacturing Semiconductor Device>

An example of a method for manufacturing the semiconductor device illustrated in FIG. 1A is described with reference to FIGS. 2A to 2F and FIGS. 3A to 3D.

First, the barrier film 101 is formed over the substrate 100 having an insulating surface. For the barrier film 101, it is preferable to form an insulating film having barrier properties against oxygen and hydrogen, for example. As for such an insulating film, an aluminum oxide film, an aluminum oxynitride film, a gallium oxide film, a gallium oxynitride film, an yttrium oxide film, an yttrium oxynitride film, a hafnium oxide film, a hafnium oxynitride film, a silicon nitride film, or the like can be given as examples.

There is no particular limitation on a substrate that can be used as the substrate 100 having an insulating surface as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate of silicon, silicon carbide, or the like; a compound semiconductor substrate of silicon germanium, gallium arsenide, indium arsenide, or indium gallium arsenide, or the like; a silicon-on-insulator (SOI) substrate; a germanium-on-insulator (GOI) substrate; or the like can be used. Further alternatively, any of these substrates provided with a semiconductor element may be used.

Further alternatively, a flexible substrate may be used as the substrate to manufacture the semiconductor device. To manufacture a flexible semiconductor device, a transistor may be directly formed over a flexible substrate; or alternatively, a transistor may be formed over a substrate and then separated from the substrate and transferred to a flexible substrate. For separation of the transistor from the substrate and transfer to the flexible substrate, a separation layer may be provided between the substrate and the transistor including the oxide semiconductor film.

Figure 2A:
FIGS. 2A to 2F are cross-sectional views illustrating one embodiment of a method for manufacturing a semiconductor device.
Figure 2B:
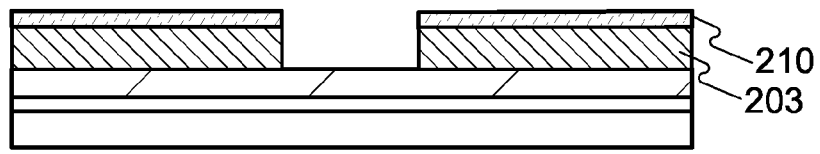
Figure 2C:
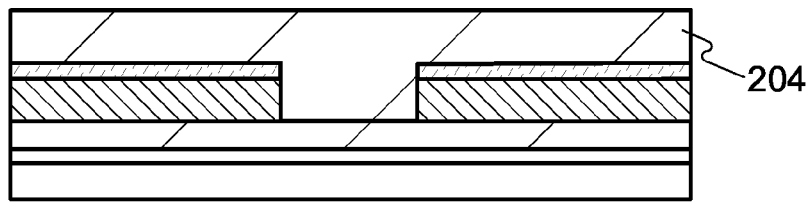

Next, the insulating film 102 is formed over the barrier film 101 (see FIG. 2A). The insulating film 102 is an insulating film containing oxygen, such as a silicon oxide film or a silicon oxynitride film.

Next, a conductive film 203 is formed over the insulating film 102 by a sputtering method, an evaporation method, a CVD method, or the like. In addition, an antioxidant film 210 is formed over the conductive film 203. Next, the conductive film 203 and the antioxidant film 210 are etched to form an opening. Through the opening, the insulating film 102 is exposed (see FIG. 2B).

The conductive film 203 can be formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a semiconductor film typified by a polycrystalline silicon film doped with an impurity element such as phosphorus, or a silicide film such as a nickel silicide film may be used as a material of the conductive film 203. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used. Moreover, a stacked structure of the above conductive material and the above metal material may be employed. For example, a 5-nm-thick titanium film, a 10-nm-thick titanium nitride film, and a 100-nm-thick tungsten film may be stacked.

Then, an insulating film 204 is formed over the conductive film 203 having the opening. The insulating film 204 is formed to fill the opening in the conductive film 203 (see FIG. 2C). The insulating film 204 is an insulating film containing oxygen, such as a silicon oxide film or a silicon oxynitride film.

Note that the base insulating film 102 and the insulating film 204 are preferably an insulating film containing excess oxygen. The insulating film containing excess oxygen can be formed using a silicon oxide film or a silicon oxynitride film containing a large amount of oxygen as a result of film formation by a plasma CVD method or a sputtering method under the conditions which are set as appropriate. After the silicon oxide film or a silicon oxynitride film is formed, oxygen may be added by an ion implantation method, an ion doping method, or plasma treatment.

Figure 2D:
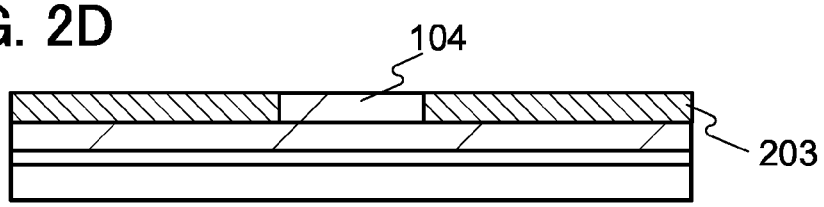
Figure 2E:
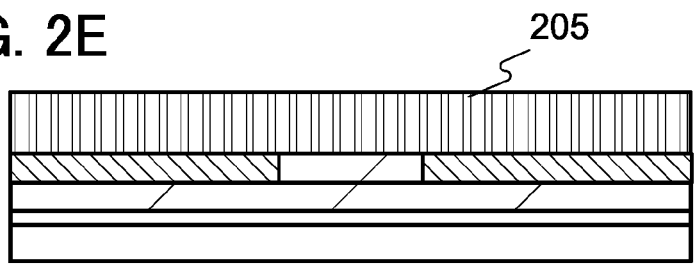
Figure 2F:
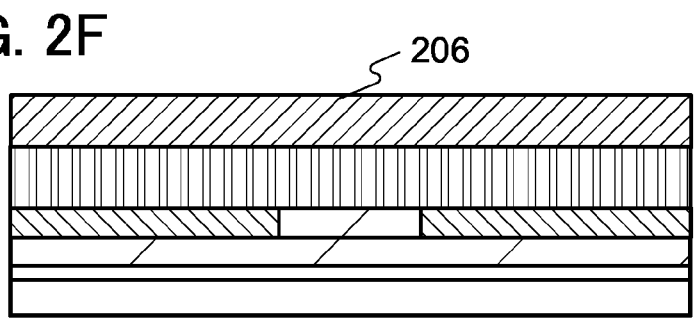

Next, part of the insulating film 204 and the antioxidant film 210 are removed, so that a top surface of the conductive film 203 is exposed (see FIG. 2D). Thus, the insulating layer 104 embedded in the opening in the conductive film 203 is formed. To remove part of the insulating film 204 and the antioxidant film 210, it is preferable to perform CMP treatment. In addition, the CMP treatment is performed under the condition where the root-mean-square (RMS) roughness of a surfaces of the conductive film 203 and the insulating layer 104 is less than or equal to 1 nm (preferably less than or equal to 0.5 nm). By the CMP treatment performed under such conditions, the planarity of a surface where the oxide semiconductor layer is formed later can be improved, and the characteristics of the transistor 400 can be improved.

The CMP treatment is treatment for planarizing a surface of an object to be processed by a combination of chemical and mechanical actions. More specifically, the CMP treatment is a method in which a polishing cloth is attached to a polishing stage, the polishing stage and an object to be processed are each rotated or swung while a slurry (an abrasive) is supplied between the object to be processed and the polishing cloth, and the surface of the object to be processed is polished by a chemical reaction between the slurry and the surface of the object to be processed and by a mechanical polishing action of the polishing cloth on the object to be processed.

Note that the CMP treatment may be performed only once or plural times. When the CMP treatment is performed plural times, it is preferable that first polishing be performed at a high polishing rate and final polishing be performed at a low polishing rate. By combining polishing with different polishing rates, planarity of the surfaces of the conductive film 203 and the insulating layer 104 can be further improved.

Then, an oxide semiconductor film 205 is formed over and in contact with the conductive film 203 and the insulating layer 104. The thickness of the oxide semiconductor film 205 is determined in consideration of the fact that the thickness corresponds to the channel length of the transistor 400. For example, the thickness of the oxide semiconductor film 205 can be 100 nm.

The oxide semiconductor film 205 may have either a single-layer structure or a stacked structure. Furthermore, the oxide semiconductor film 205 may either have an amorphous structure or a crystalline structure.

As a deposition method of the oxide semiconductor film 205, a sputtering method, a coating method, a molecular beam epitaxy (MBE) method, a CVD method, a pulse laser deposition method, an atomic layer deposition (ALD) method, or the like can be used as appropriate.

In the formation of the oxide semiconductor film 205, the hydrogen concentration in the oxide semiconductor film 205 is preferably reduced as much as possible. In order to reduce the hydrogen concentration, for example, in the case where the oxide semiconductor layer is formed by a sputtering method, oxygen, a high-purity rare gas (typically, argon) from which impurities such as hydrogen, water, a hydroxyl group, and a hydride are removed, or a mixed gas of oxygen and the rare gas is used as appropriate as an atmosphere gas supplied to a deposition chamber of a sputtering apparatus.

The oxide semiconductor layer is formed in such a manner that a sputtering gas from which hydrogen and moisture are removed is introduced into a deposition chamber while moisture remaining in the deposition chamber is removed, whereby the concentration of hydrogen in the deposited oxide semiconductor layer can be reduced. In order to remove moisture remaining in the deposition chamber, an entrapment vacuum pump such as a cryopump, an ion pump, or a titanium sublimation pump is preferably used. The evacuation unit may be a turbo molecular pump provided with a cold trap. A cryopump has a high capability in removing a hydrogen molecule, a compound containing a hydrogen atom such as water ($H_2O$) (preferably, also a compound containing a carbon atom), and the like, allowing a reduction in the impurity concentration in the oxide semiconductor film 205 formed in the deposition chamber which is evacuated with the cryopump.

Further, in the case where the oxide semiconductor film 205 is formed by a sputtering method, the relative density (the fill rate) of a metal oxide target which is used for forming the oxide semiconductor film is greater than or equal to 90% and less than or equal to 100%, preferably greater than or equal to 95% and less than or equal to 99.9%. With use of a metal oxide target with a high relative density, the dense oxide semiconductor film 205 can be formed.

To reduce the impurity concentration in the oxide semiconductor film 205, it is also effective to form the oxide semiconductor film 205 while the substrate 100 is kept at high temperature. The heating temperature of the substrate 100 is higher than or equal to 150° C. and lower than or equal to 450° C., and preferably the substrate temperature is higher than or equal to 200° C. and lower than or equal to 350° C. By heating the substrate at a high temperature during the film formation, the oxide semiconductor film 205 having crystallinity can be formed.

An oxide semiconductor used for the oxide semiconductor film 205 contains at least indium (In). In particular, the oxide semiconductor film 205 preferably contains indium (In) and zinc (Zn). As a stabilizer for reducing change in electric characteristics of a transistor including the oxide semiconductor, gallium (Ga) is preferably additionally contained. Further, it is preferable that one or more elements selected from tin (Sn), hafnium (Hf), aluminum (Al), and zirconium (Zr) be contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, any of the following can be used: indium oxide, tin oxide, zinc oxide, an In—Zn-based oxide, an In—Mg-based oxide, an In—Ga-based oxide, an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that, for example, an "In—Ga—Zn-based oxide" means an oxide containing In, Ga, and Zn as its main components and there is no particular limitation on the ratio of In, Ga, and Zn. The In—Ga—Zn-based oxide may contain another metal element in addition to In, Ga, and Zn.

Note that a transistor including an oxide semiconductor containing indium is not limited to that described above, and a material with an appropriate composition may be used depending on required electrical characteristics (e.g., field-effect mobility and threshold voltage) of the transistor. In order to obtain the needed electrical characteristics, it is preferable that the carrier density, the impurity concentration, the defect density, the atomic ratio between a metal element and oxygen, the interatomic distance, the density, and the like be set to appropriate values.

Heat treatment is preferably performed after the formation of the oxide semiconductor film 205. The heat treatment is preferably performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure atmosphere. Alternatively, the heat treatment may be performed in such a manner that heat treatment is performed in an inert gas atmosphere, and then another heat treatment is performed in an atmosphere containing an oxidizing gas at 10 ppm or more in order to compensate released oxygen. The heat treatment here allows impurities such as hydrogen and water to be removed from the oxide semiconductor film 205. By this heat treatment, oxygen can be supplied to the oxide semiconductor film 205 from the insulating layer 104. In this treatment, when the insulating film 102 and the insulating layer 104 contain excess oxygen, oxygen can be supplied efficiently to the oxide semiconductor film 205. Note that the heat treatment may be performed after the oxide semiconductor film 205 is processed into an island shape to form the oxide semiconductor layer 105.

A structure of an oxide semiconductor film that is used as an oxide semiconductor layer of a transistor in this embodiment is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φscan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when 0 scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With use of the CAAC-OS film in a transistor, variation in the electrical characteristics of the transistor due to irradiation with visible light or ultraviolet light is small.

Next, a microcrystalline oxide semiconductor film is described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than or equal to the diameter of a crystal part. Further, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. However, there is no regularity of crystal orientation between different crystal parts in the nc-OS film; hence, the nc-OS film has a higher density of defect states than the CAAC-OS film.

Note that an oxide semiconductor film may be a stacked film including two or more kinds of an amorphous oxide semiconductor film, a microcrystalline oxide semiconductor film, and a CAAC-OS film, for example.

An example of a method for forming a CAAC-OS film will be described under.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle or pellet-like sputtered particle reaches a substrate while maintaining its crystal state, whereby the CAAC-OS film can be formed.

The flat-plate-like sputtered particle or pellet-like sputtered particle has, for example, an equivalent circle diameter of a plane parallel to the a-b plane greater than or equal to 3 nm and less than or equal to 10 nm, and a thickness (length in the direction perpendicular to the a-b plane) of greater than or equal to 0.7 nm and less than 1 nm. Note that in the flat-plate-like sputtered particle or pellet-like sputtered particle, the plane parallel to the a-b plane may be a regular triangle or a regular hexagon. Here, the term "equivalent circle diameter of a plane" refers to the diameter of a perfect circle having the same area as the plane.

For the deposition of the CAAC-OS film, the following conditions are preferably used.

By increasing the substrate temperature during the deposition, migration of sputtered particles is likely to occur after the sputtered particles reach a substrate surface. Specifically, the substrate temperature during the deposition is higher than or equal to 100° C. and lower than or equal to 740° C. By increasing the substrate temperature during the deposition, when the flat-plate-like sputtered particles or pellet-like sputtered particle reach the substrate, migration occurs on the substrate surface, so that a flat plane of the sputtered particles is attached to the substrate. At this time, the sputtered particle is charged positively, whereby sputtered particles are attached to the substrate while repelling each other; thus, the sputtered particles do not overlap with each other randomly, and a CAAC-OS film with a uniform thickness can be deposited. When the temperature for deposition is too high, zinc contained in a target might be sublimed; therefore, the substrate temperature is higher than or equal to 200° C. and lower than or equal to 500° C., preferably higher than or equal to 200° C. and lower than or equal to 350° C.

By reducing the amount of impurities entering the CAAC-OS layer during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

Alternatively, the CAAC-OS film is formed by the following method.

First, a first oxide semiconductor film is formed to a thickness greater than or equal to 1 nm and less than 10 nm. The first oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that the first oxide semiconductor film becomes a first CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the first oxide semiconductor film for a short time. At the same time, the heat treatment in an inert atmosphere may generate oxygen vacancies in the first oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the first oxide semiconductor film for a shorter time.

The first oxide semiconductor film can be crystallized easier in the case where the thickness is greater than or equal to 1 nm and less than 10 nm than in the case where the thickness is greater than or equal to 10 nm.

Next, a second oxide semiconductor film having the same composition as the first oxide semiconductor film is formed to a thickness greater than or equal to 10 nm and less than or equal to 50 nm. The second oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that solid phase growth of the second oxide semiconductor film is performed using the first CAAC-OS film, thereby forming a second CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the second oxide semiconductor film for a short time. At the same time, the heat treatment in an inert atmosphere may generate oxygen vacancies in the second oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the second oxide semiconductor film for a shorter time.

As described above, a CAAC-OS film with a total thickness greater than or equal to 10 nm can be formed. The CAAC-OS film can be favorably used as the oxide semiconductor layer.

Described next is a method for forming an oxide film in the case where a formation surface has a low temperature because, for example, the substrate is not heated (for example, the temperature is lower than 130° C., lower than 100° C., lower than 70° C. or at room temperatures (around 20° C. to 25° C.)).

In the case where the formation surface has a low temperature, sputtered particles fall irregularly to the deposition surface. For example, migration does not occur; therefore, the sputtered particles are randomly deposited on the deposition surface including a region where other sputtered particles have been deposited. That is, an oxide film obtained by the deposition might have a non-uniform thickness and a disordered crystal alignment. The oxide film obtained in the above manner maintains the crystallinity of the sputtered particles to a certain degree and thus has a crystal part (nanocrystal).

For example, in the case where the pressure at the deposition is high, the frequency with which the flying sputtered particle collides with another particle (e.g., an atom, a molecule, an ion, or a radical) of argon or the like is increased. When the flying sputtered particle collides with another particle (resputtered), the crystal structure of the sputtered particle might be broken. For example, when the sputtered particle collides with another particle, the plate-like shape of the sputtered particle cannot be kept, and the sputtered particle might be broken into parts (e.g., atomized). At this time, when atoms obtained from the sputtered particle are deposited on the formation surface, an amorphous oxide semiconductor film might be formed.

In addition, when a process in which a liquid is used or a process in which a solid target is vaporized is employed instead of a sputtering method using a target having a polycrystalline oxide as a starting point, separated atoms fly and are deposited on a deposition surface and thus an amorphous oxide film is formed in some cases. Further, for example, by a laser ablation method, atoms, molecules, ions, radicals, clusters, or the like released from the target flies to be deposited over the formation surface; therefore, an amorphous oxide film might be formed.

Next, a conductive film 206 is formed over the oxide semiconductor film 205. The conductive film 206 can be formed using a material and a step similar to those of the conductive film 203 (see FIG. 2F).

Next, a resist mask is formed over the conductive film 206, and through an anisotropic etching step using the resist mask, the conductive film 203, the oxide semiconductor film 205, and the conductive film 206 are processed into island shapes. By this etching step, the first electrode 103, the oxide semiconductor layer 105, and the second electrode 106 are formed from the conductive film 203, the oxide semiconductor film 205, and the conductive film 206, respectively (see FIG. 3A).

Next, an insulating film 207 is formed to cover the first electrode 103, the oxide semiconductor layer 105, and the second electrode 106. A conductive film 208 is formed over the insulating film 207 by a sputtering method, an evaporation method, a CVD method, or the like, and then, the conductive film 208 and the insulating film 207 are subjected to anisotropic etching using a resist mask, thereby being processed into island shapes (see FIG. 3B).

The insulating film 207 has a thickness greater than or equal to 1 nm and less than or equal to 20 nm, for example, and can be formed by a sputtering method, an MBE method, a CVD method, a pulsed laser deposition method, an ALD method, or the like as appropriate. The insulating film 207 may also be formed with a sputtering apparatus which performs film deposition with surfaces of a plurality of substrates set substantially perpendicular to a surface of a sputtering target. Further, a metal organic chemical vapor deposition (MOCVD) method may be used. For example, a gallium oxide film deposited by an MOCVD method can be used as the insulating film 207.

The insulating film 207 can be formed using a silicon oxide film, a gallium oxide film, a gallium zinc oxide film, a zinc oxide film, an aluminum oxide film, a silicon nitride film, a silicon oxynitride film, an aluminum oxynitride film, or a silicon nitride oxide film. The insulating film 207 preferably contains oxygen in a portion which is in contact with the oxide semiconductor layer 105. In particular, the insulating film 207 preferably contains an amount of oxygen which exceeds the stoichiometric composition in the film (bulk). In this embodiment, a silicon oxynitride film formed by a CVD method is used as the gate insulating film. By using a silicon oxynitride film containing excess oxygen as the gate insulating film, oxygen can be supplied to the oxide semiconductor layer 105, leading to good characteristics. Furthermore, the insulating film 207 is processed into the gate insulating layer 107 in a later step; thus formation of the insulating film 207 is preferably performed in consideration of the size or the like, of the transistor 400 that is to be formed.

Alternatively, the insulating film 207 can be formed using a high-k material such as hafnium oxide, yttrium oxide, hafnium silicate (HfSi$_x$O$_y$ (x>0, y>0)), hafnium silicate to which nitrogen is added (HfSi$_x$O$_y$N$_z$ (x>0, y>0, z>0)), hafnium aluminate (HfAl$_x$O$_y$ (x>0, y>0)), or lanthanum oxide. The insulating film 207 may be either a single layer or a stacked layer.

The conductive film 208 can be formed using a material similar to that of the conductive film 203 and the conductive film 206. The conductive film 208 may have either a single-layer structure or a stacked structure.

Next, the conductive film 208 and the insulating film 207 are partly removed by CMP treatment or the like, so that a top surface of the second electrode 106 is exposed. At this step, the second electrode 106 is partly removed, and the thickness thereof is reduced in some cases. By the treatment, the gate insulating layer 107 covering side surfaces of the first electrode 103, the oxide semiconductor layer 105, and the second electrode 106 is formed from the insulating film 207. In addition, the ring-shaped gate electrode 108 covering the side surface of the oxide semiconductor layer 105 with the gate insulating layer 107 interposed therebetween is formed from the conductive film 208.

Figure 3A:
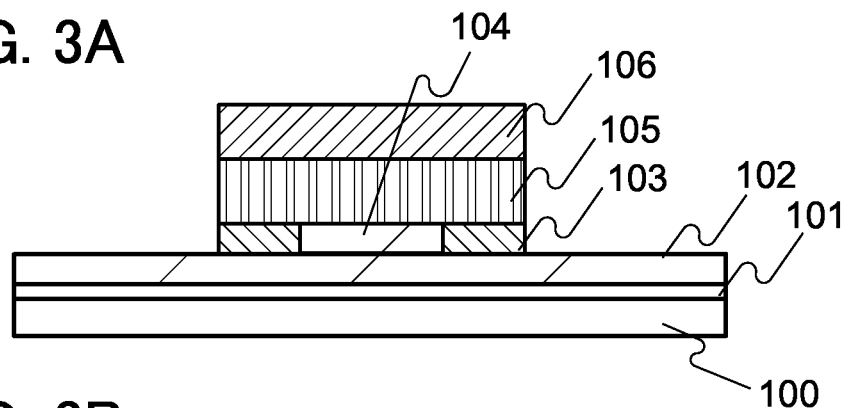
FIGS. 3A to 3D are cross-sectional views illustrating one embodiment of a method for manufacturing a semiconductor device.
Figure 3B:
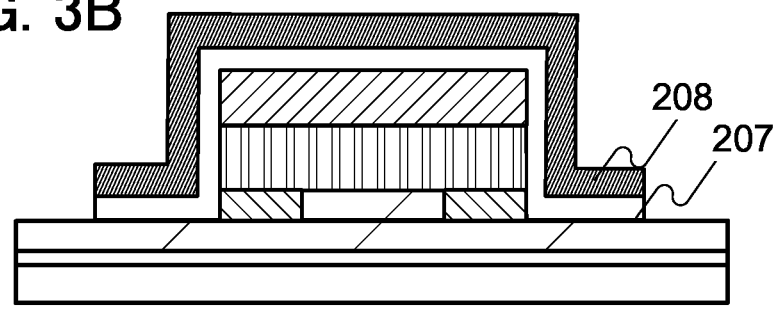
Figure 3C:
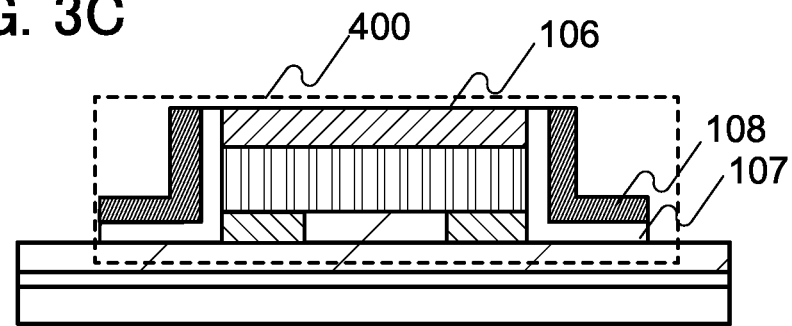

Through the above steps, the transistor 400 can be manufactured (see FIG. 3C).

Figure 3D:
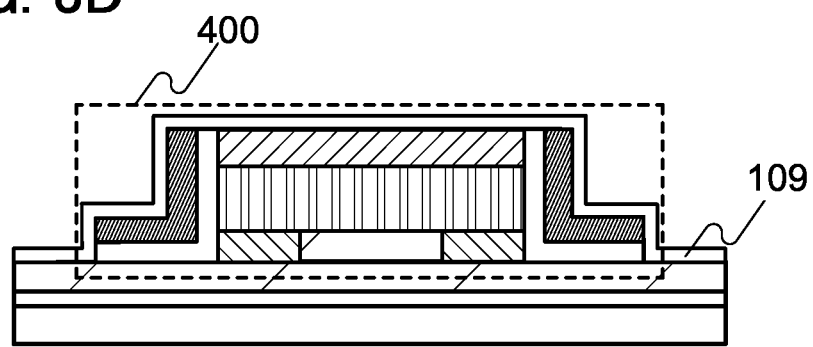

In FIG. 3D, the barrier film 109 covering the transistor 400 is formed. As the barrier film 109, an insulating film having barrier properties against oxygen and hydrogen can be used as in the case of the barrier film 101. The transistor 400 is surrounded by the barrier film 101 and the barrier film 109, whereby oxygen contained in the insulating film 102, the insulating layer 104, and the oxide semiconductor layer 105 can be prevented from being released. In addition, entry of impurities such as hydrogen to the oxide semiconductor layer 105 from the outside can be prevented.

Figure 4A:
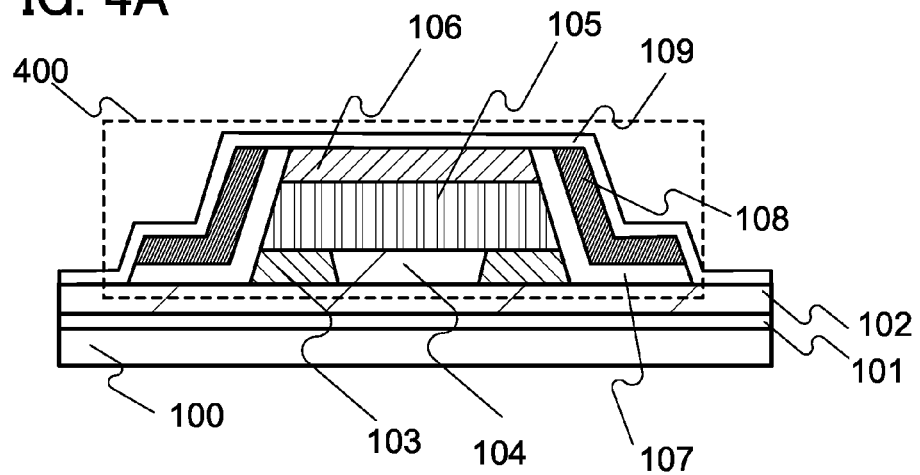
FIGS. 4A to 4C are each a cross-sectional view illustrating one embodiment of a semiconductor device.

Note that in the above formation step, etching conditions or the like may be adjusted so that at least one of end portions of the first electrode 103, the oxide semiconductor layer 105, the second electrode 106, the gate insulating layer 107, and the gate electrode 108 has a tapered shape. FIG. 4A is a cross-sectional view of a modification example of the transistor 400 in which each end portion of the first electrode 103, the oxide semiconductor layer 105, the second electrode 106, the gate insulating layer 107, and the gate electrode 108 has a tapered shape. With the tapered end portions, coverage with a film formed after the step of processing the end portions to have the tapered shapes in a process of forming the transistor is improved.

Figure 4B:
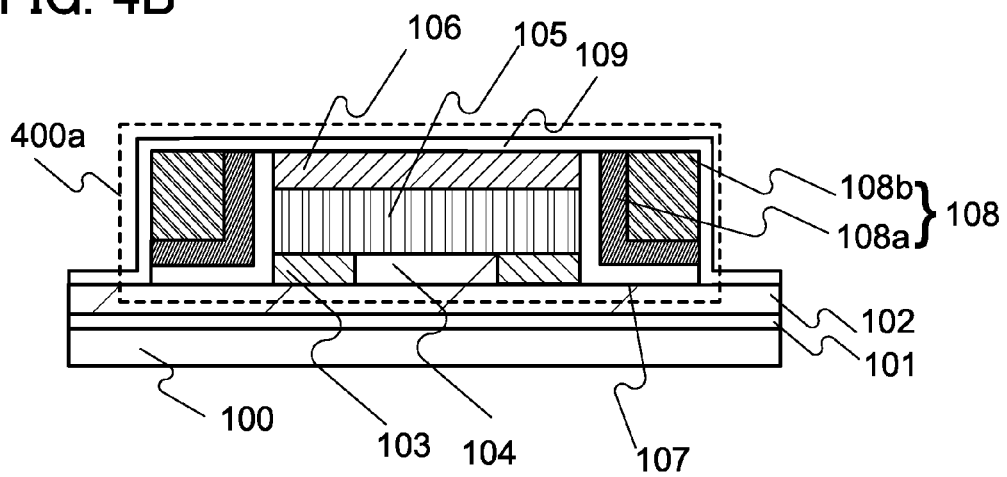

FIG. 4B is a cross-sectional view of a transistor 400a that is a modified example of the transistor 400. In the transistor 400a, the gate electrode 108 is a stacked layer of a conductive layer 108a and a conductive layer 108b, and the thickness of the gate electrode 108 is larger than that of the gate electrode of the transistor 400.

In order to form the transistor 400a, in the formation process illustrated in FIGS. 2A to 2F and FIGS. 3A to 3D, a conductive film is further formed over the conductive film 208 after the insulating film 207 and the conductive film 208 are formed, so that unevenness of the conductive film 208 caused by the first electrode 103, the oxide semiconductor layer 105, and the second electrode 106 is compensated. The conductive film can be formed using a material similar to that of the conductive film 208. The insulating film 207, the conductive film 208, and the conductive film are processed into island shapes, and the insulating film 207, the conductive film 208, and the conductive film are partly removed by CMP treatment or the like to expose the second electrode 106, so that the gate electrode 108 including a conductive layer 108a and a conductive layer 108b can be formed.

Figure 4C:
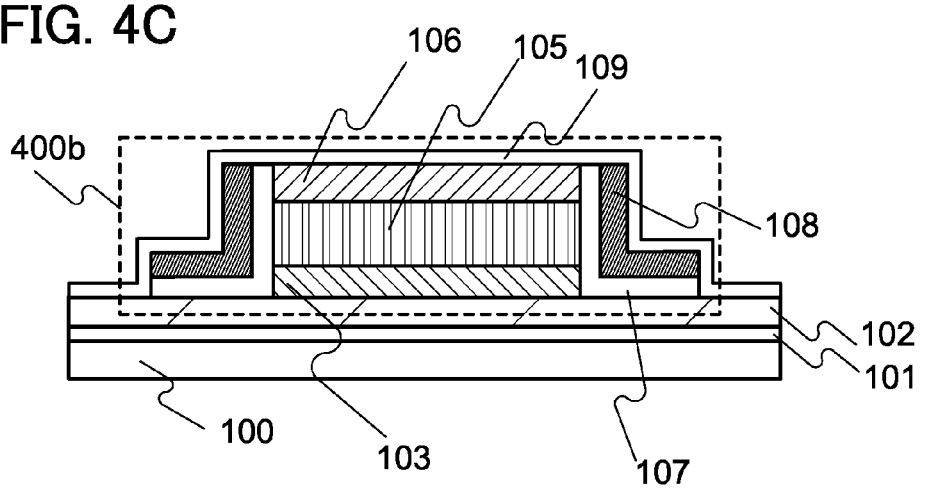

FIG. 4C is a cross-sectional view of a transistor 400b that is a modified example of the transistor 400. In order to form the transistor 400b, the first electrode 103 without an opening is used.

According to this embodiment, the channel length of the transistor 400 can be easily adjusted with the thickness of the oxide semiconductor layer 105 even in a miniaturized structure. Furthermore, with a structure in which the ring-shaped electrode 108 surrounds the side surface of the oxide semiconductor layer 105 with the gate insulating layer 107 interposed therebetween, the effective channel width of the transistor can be made large, and accordingly, the amount of on-state current of the transistor can be increased.

In addition, according to this embodiment, an opening is made in the first electrode, and the insulating layer 104 containing oxygen is embedded in the opening and be in contact with the oxide semiconductor layer, whereby oxygen can be supplied to the oxide semiconductor layer 105. With supplied oxygen, oxygen vacancies in the oxide semiconductor layer are filled, whereby the oxygen vacancies are reduced, and the reliability of the transistor using the oxide semiconductor layer 105 can be increased.

Thus, a miniaturized transistor having highly stable electrical characteristics can be provided.

The structures, the methods, and the like described in this embodiment can be combined as appropriate with any of the structures, the methods, and the like described in the other embodiments.

(Embodiment 2)

In this embodiment, an example of a semiconductor device different from that in Embodiment 1 and an example of a manufacturing method thereof will be described with reference to FIG. 5, FIGS. 6A to 6C, and FIGS. 7A to 7D.

Note that common portions to those in FIGS. 1A to 1D, FIGS. 2A to 2F, and FIGS. 3A to 3D are denoted by the same reference numerals, and description thereof is omitted.

Figure 5:
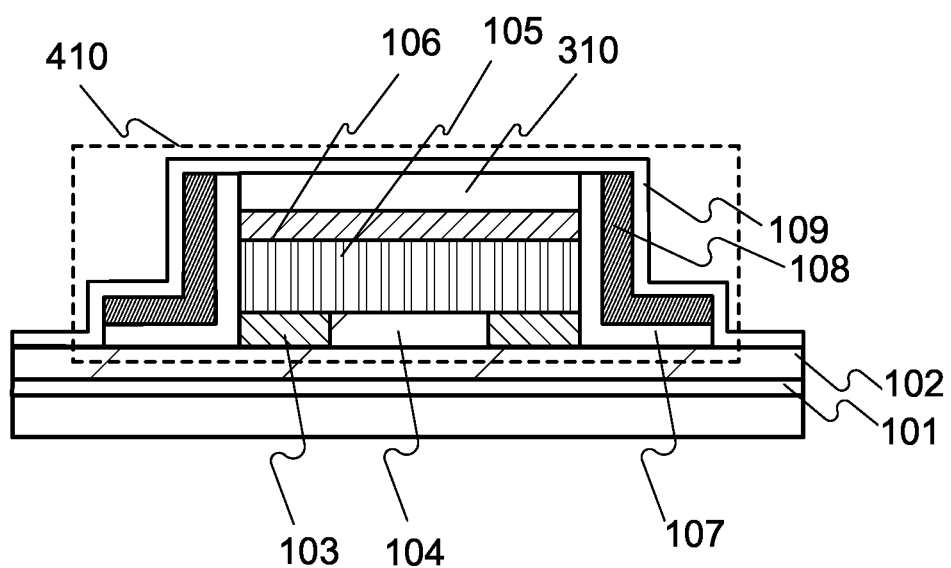
FIG. 5 is a cross-sectional view illustrating one embodiment of a semiconductor device.

A transistor 410 included in a semiconductor device illustrated in FIG. 5 is a vertical transistor, in which the first electrode 103 having an opening, the oxide semiconductor layer 105, the second electrode 106, and a cap insulating layer 310 are stacked in this order, the gate insulating layer 107 is provided to be in contact with side surfaces of the first electrode 103, the oxide semiconductor layer 105, the second electrode 106, and the cap insulating layer 310, and the ring-shaped gate electrode 108 is provided to cover the side surface of the oxide semiconductor layer 105 with the gate insulating layer 107 interposed therebetween.

The first electrode 103 has a ring form, and in the opening in the first electrode 103, the insulating layer 104 is embedded. The insulating layer 104 is in contact with the oxide semiconductor layer 105.

The insulating layer 104 is an insulating layer containing oxygen, such as a silicon oxide film or a silicon oxynitride film.

Figure 6A:
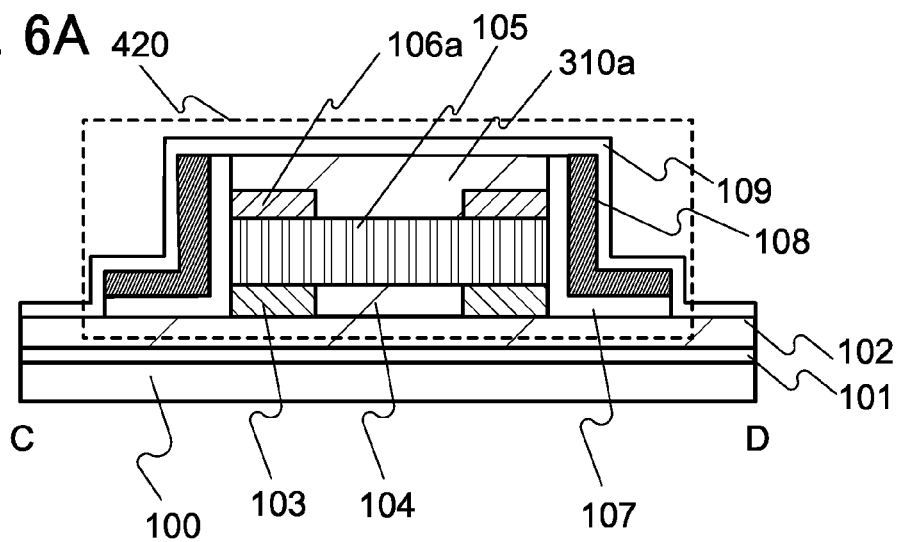
FIGS. 6A to 6C are cross-sectional views and a top view illustrating one embodiment of a semiconductor device.
Figure 6B:
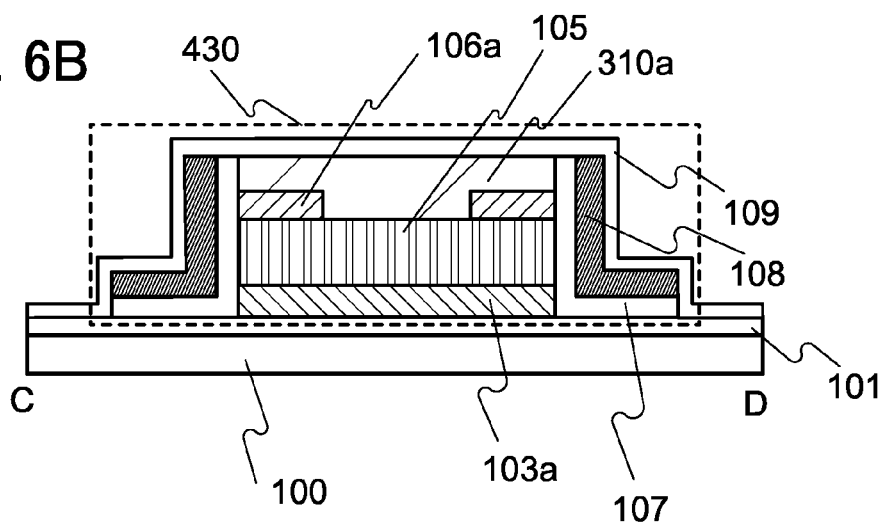
Figure 6C:
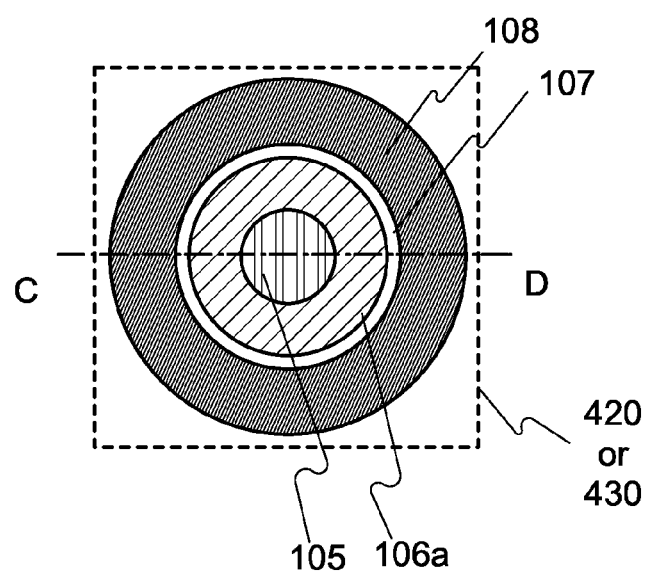

FIG. 6A illustrates an example of a cross-sectional view of a semiconductor device including a transistor 420 that is a modified example of the transistor 410. FIG. 6B illustrates an example of a cross-sectional view of a semiconductor device including a transistor 430 that is a modified example of the transistor 420. FIG. 6C illustrates an example of a top view of the transistor 420 or 430. FIGS. 6A and 6B are cross-sectional views along dashed-dotted line C-D in FIG. 6C. In FIG. 6C, some films are not illustrated for simplicity.

The transistor 420 illustrated in FIG. 6A has a structure similar to that of the transistor 410 except that a second electrode 106a having an opening is provided instead of the second electrode 106 and that an insulating layer 310a in contact with the oxide semiconductor layer 105 is provided instead of the cap insulating layer 310.

In the transistor 420, the insulating layer 310a is an insulating layer containing oxygen, such as a silicon oxide film or a silicon oxynitride film. Moreover, the insulating layer 310a is preferably an insulating layer containing excess oxygen.

In the transistor 420, the insulating layers containing oxygen are provided over and below the oxide semiconductor layer 105, whereby oxygen can be supplied more efficiently to the oxide semiconductor layer 105.

The transistor 430 illustrated in FIG. 6B has a structure similar to that of the transistor 420 except that a first electrode 103a without an opening is provided instead of the first electrode 103 and that the insulating layer 104 is not provided.

Moreover, in the semiconductor device illustrated in FIG. 6B, the insulating film 102 is not provided.

An example of a method for manufacturing the semiconductor device in this embodiment is described with reference to FIGS. 7A to 7D.

First, over the substrate 100, the following components are formed: the barrier film 101; the insulating film 102; the conductive film 203 having an opening; the insulating layer 104 embedded in the opening in the conductive film 203; the oxide semiconductor film 205 that is over the conductive film 203 and the insulating layer 104; and the conductive film 206 that is over the oxide semiconductor film 205. For the steps up to here, the description in Embodiment 1 and FIGS. 2A to 2E can be referred to.

Figure 7A:
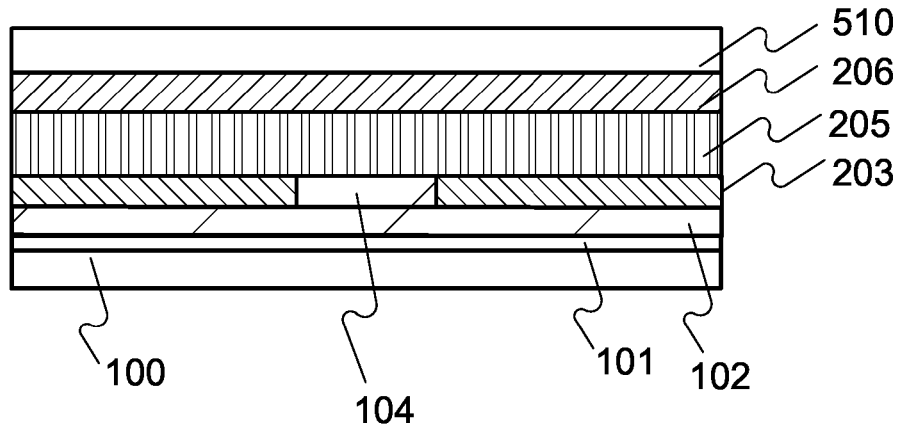
FIGS. 7A to 7D are cross-sectional views illustrating one embodiment of a method for manufacturing a semiconductor device.
Figure 7B:
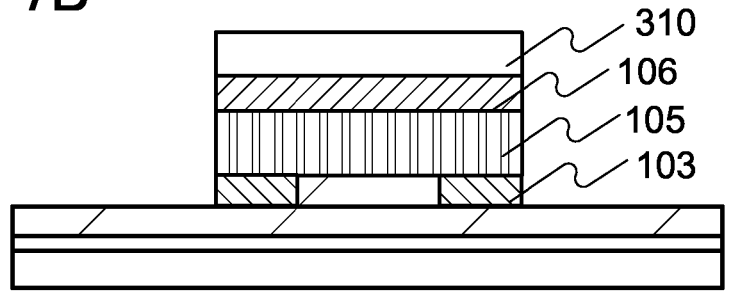

In this embodiment, an insulating film 510 is further formed over the conductive film 206 as illustrated in FIG. 7A. Examples of the insulating film 510 include a silicon oxide film or a silicon oxynitride film.

Next, a resist mask is formed over the insulating film 510, and the conductive film 203, the oxide semiconductor film 205, the conductive film 206, and the insulating film 510 are processed by anisotropic etching using the resist mask to have island shapes. By this etching step, the first electrode 103, the oxide semiconductor layer 105, the second electrode 106, and the cap insulating layer 310 are formed from the conductive film 203, the oxide semiconductor film 205, the conductive film 206, and the insulating film 510, respectively (see FIG. 7B).

Figure 7C:
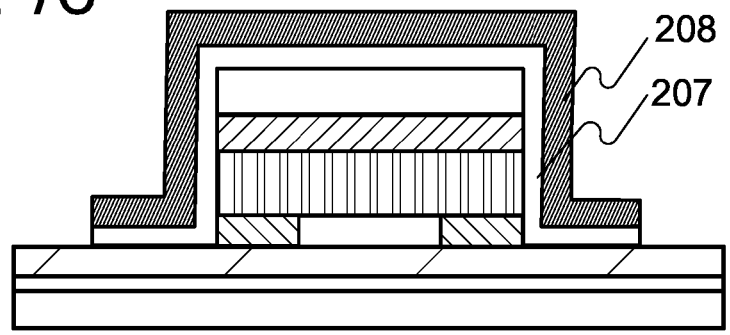
Figure 7D:
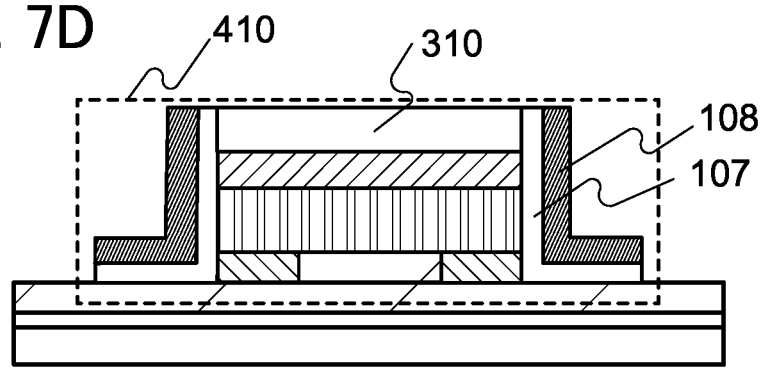

Next, the insulating film 207 and the conductive film 208 are formed and then processed by anisotropic etching using a resist mask into island shapes (see FIG. 7C). Moreover, the conductive film 208 and the insulating film 207 are partly removed by CMP treatment or the like, so that a top surface of the cap insulating layer 310 is exposed. Through the above steps, the gate insulating layer 107 is provided to be in contact with the side surfaces of the first electrode 103, the oxide semiconductor layer 105, the second electrode 106, and the cap insulating layer 310, and the ring-shaped gate electrode 108 is provided to cover the side surface of the oxide semiconductor layer 105 with the gate insulating layer 107 interposed therebetween; accordingly, the transistor 410 is completed (see FIG. 7D).

Furthermore, as illustrated in FIG. 5, the barrier film 109 may be provided to cover the transistor 410.

Note that when the cap insulating layer 310 is provided as in this embodiment, the second electrode 106 is not needed to be thick for the margin of CMP treatment for forming the gate electrode 108 and the gate insulating layer 107. When the second electrode 106 is thick, the parasitic capacitance generated in a portion where the second electrode 106 faces the gate electrode 108 becomes high, which may affect the characteristics of the transistor 410.

In the case where the transistor 420 illustrated in FIG. 6A is formed, an opening reaching the oxide semiconductor film 205 may be formed in the conductive film 206 before the insulating film 510 is formed, and then the insulating film 510 may be formed to fill the opening. Then, the conductive film 206 and the insulating film 510 are processed to have an island shape, whereby the second electrode 106a having an opening and the insulating layer 310a in contact with the oxide semiconductor layer 105 through the opening in the second electrode 106a can be formed.

In the case where the transistor 430 illustrated in FIG. 6B is formed, the step of forming an opening in the conductive film 203 and the step of forming the insulating layer 104 may be omitted in the process of forming the transistor 420. Moreover, in the process of manufacturing the semiconductor device illustrated in FIG. 6B, the insulating film 102 is not formed.

In each of the processes for manufacturing the semiconductor devices illustrated in FIGS. 6A and 6B, an insulating film containing oxygen, such as a silicon oxide film or a silicon oxynitride film is formed as the insulating film 510. The insulating film 510 is preferably an insulating film containing excess oxygen.

In each of the processes for manufacturing the semiconductor devices illustrated in FIGS. 6A and 6B, it is preferable that heat treatment be performed after formation of the insulating film 510 to supply oxygen to the oxide semiconductor film 205 from the insulating film 510. The heat treatment may be performed after the oxide semiconductor layer 105 and the insulating layer 310a are formed.

According to this embodiment, the channel length of a transistor even with a miniaturized structure can be easily adjusted. In addition, when the ring-shaped gate electrode 108 surrounds the side surface of the oxide semiconductor layer 105 with the gate insulating layer 107 interposed therebetween, the effective channel width of the transistor can be large; accordingly, the amount of on-state current of the transistor can be increased.

Furthermore, according to this embodiment, when one of or both the first electrode and the second electrode have an opening and an insulating layer containing oxygen is embedded in the opening and be in contact with the oxide semiconductor layer, oxygen can be supplied to the oxide semiconductor layer. Oxygen vacancies in the oxide semiconductor layer 105 are filled with the supplied oxygen and accordingly reduced. Thus, the reliability of the transistor 410, 420, or 430 using the oxide semiconductor layer 105 can be increased.

Moreover, according to this embodiment, with the cap insulating film provided to cover the second electrode, the effect of parasitic capacitance caused by an increase in the thickness of the second electrode can be lowered, and the reliability of the transistor can be increased.

Thus, a miniaturized transistor having highly stable electrical characteristics can be provided.

The structures, the methods, and the like described in this embodiment can be combined as appropriate with any of the structures, the methods, and the like described in the other embodiments.

(Embodiment 3)

In this embodiment, an example of a semiconductor device (memory device) which includes the transistor described in this specification, which can hold stored data even when not powered, and which has an unlimited number of write cycles will be described with reference to drawings.

Figure 8A:
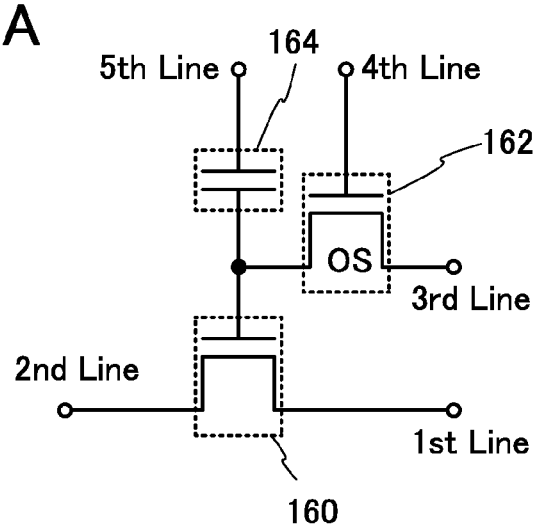
FIGS. 8A and 8B are a circuit diagram and a cross-sectional view illustrating one embodiment of a semiconductor device.

FIG. 8A is a circuit diagram illustrating a semiconductor device of this embodiment.

The semiconductor device illustrated in FIG. 8A includes a transistor 160, a transistor 162, and a capacitor 164. For the transistor 162, a structure similar to those of the transistors 400, 410, 420, and 430 described in Embodiment 1 and Embodiment 2 can be employed.

For the transistor 160, a transistor using a semiconductor material other than an oxide semiconductor, such as a silicon semiconductor, can be used.

In FIG. 8A, a first wiring (1st Line) is electrically connected to a source of the transistor 160. A second wiring (2nd Line) is electrically connected to a drain of the transistor 160. In addition, a third wiring (3rd Line) and one of a source and drain of the transistor 162 are electrically connected to each other, and a fourth wiring (4th Line) and the gate of the transistor 162 are electrically connected to each other. A gate of the transistor 160 and the other of the source and the drain of the transistor 162 are electrically connected to one electrode of the capacitor 164. A fifth wiring (5th Line) and the other electrode of the capacitor 164 are electrically connected to each other.

The transistor 160 including a silicon semiconductor or the like can easily operate at high speed. In contrast, the transistor 162 including an oxide semiconductor enables charge to be held for a long time owing to its characteristics.

Although all the above transistors are n-channel transistors here, it is needless to say that p-channel transistors can be used.

The semiconductor device illustrated in FIGS. 8A and 8B can write, retain, and read data as described below, utilizing its feature in which the potential of the gate of the transistor 160 can be retained.

Writing and holding of data is described with reference to FIG. 8A. First, the potential of the fourth wiring is set to a potential at which the transistor 162 is turned on, so that the transistor 162 is turned on. Accordingly, the potential of the third wiring is supplied to the gate of the transistor 160 and the capacitor 164. That is, a predetermined charge is supplied to the gate of the transistor 160 (writing). Here, charge for supplying either of two different potential levels (hereinafter referred to as low-level charge and high-level charge) is given. After that, the potential of the fourth wiring is set to a potential at which the transistor 162 is off, so that the transistor 162 is turned off. Thus, the charge supplied to the gate of the transistor 160 is held (holding).

The amount off-state current of the transistor 162 is extremely small; thus, the charge at the gate of the transistor 160 is retained for a long time.

Next, reading of data will be described. By supplying an appropriate potential (reading potential) to the fifth wiring with a predetermined potential (constant potential) supplied to the first wiring, the potential of the second wiring varies depending on the amount of charge held in the gate electrode of the transistor 160. This is because in general, when the transistor 160 is an n-channel transistor, an apparent threshold voltage $V_{th\_H}$ in the case where the high-level charge is given to the gate of the transistor 160 is lower than an apparent threshold voltage $V_{th\_L}$ in the case where the low-level charge is given to the gate of the transistor 160. Here, an apparent threshold voltage refers to the potential of the fifth wiring, which is needed to turn on the transistor 160. Thus, the potential of the fifth wiring is set to a potential $V_0$ which is between $V_{th\_H}$ and $V_{th\_L}$ whereby charge given to the gate of the transistor 160 can be determined. For example, in the case where a high-level charge is given in writing, when the potential of the fifth wiring is set to $V_0$ ($>V_{th\_H}$), the transistor 160 is turned on. In the case where a low-level charge is given in writing, even when the potential of the fifth wiring is set to $V_0$ ($<V_{th\_L}$), the transistor 160 remains in an off state. Therefore, the data held can be read by measuring the potential of the second wiring.

Note that in the case where memory cells are arrayed to be used, only data of desired memory cells needs to be read. In the case where reading is not performed, a potential at which the transistor 160 is turned off regardless of the state of the gate electrode of the transistor 160, that is, a potential smaller than $V_{th\_H}$ may be supplied to the fifth wiring. Alternatively, a potential at which the transistor 160 is turned on regardless of a state of the gate, that is, a potential higher than $V_{th\_L}$ may be supplied to the fifth wiring.

Figure 8B:
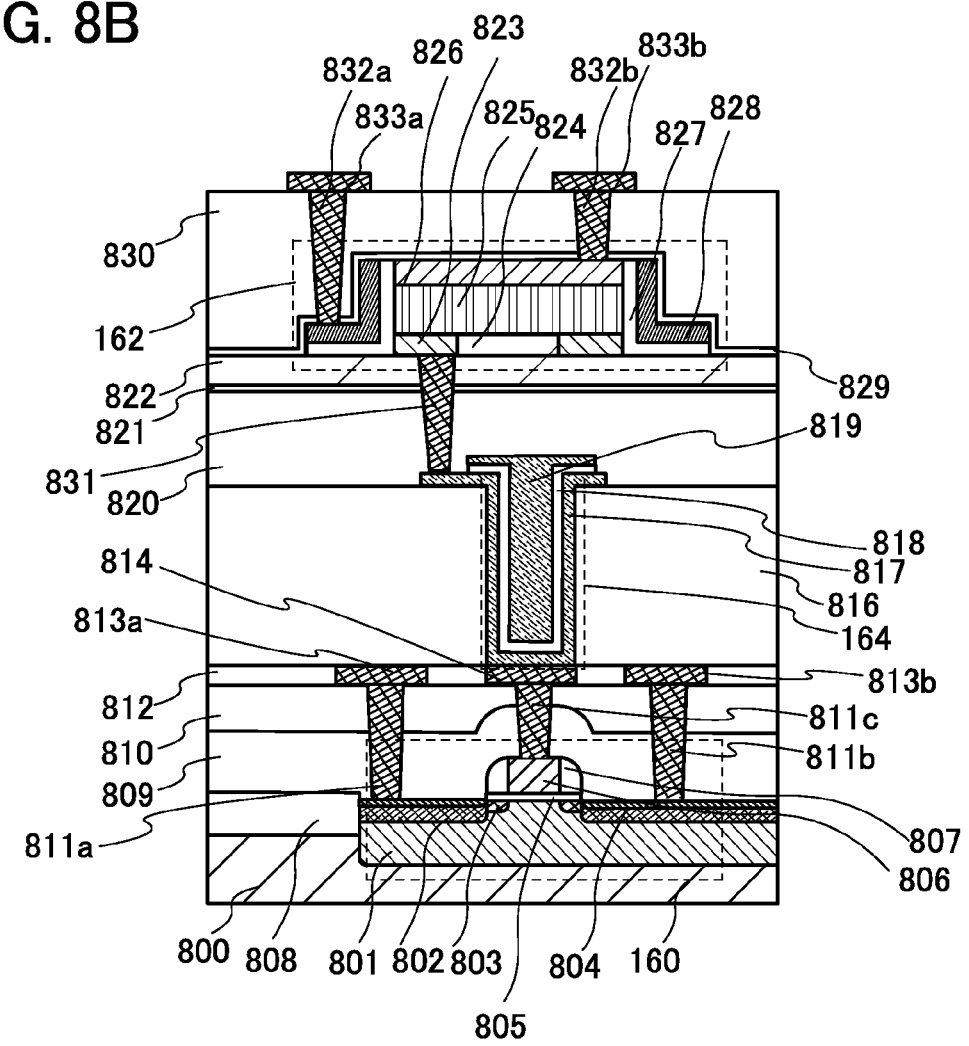

FIG. 8B illustrates an example of a cross-sectional structure of the semiconductor device, corresponding to the circuit configuration in FIG. 8A.

In the semiconductor device illustrated in FIG. 8B, the transistor 160 formed using a single crystal silicon substrate 800, the capacitor 164, and the transistor 162 with a structure similar to those of the transistors 400, 410, 420, and 430 described in Embodiment 1 and Embodiment 2 are stacked.

In the example illustrated in FIG. 8B, the transistor 160 is formed using the single crystal silicon substrate 800 and is isolated from another element with a shallow trench isolation (STI) 808. In the single crystal silicon substrate 800 where the transistor 160 is formed, a well 801 to which an impurity imparting conductivity, such as boron, phosphorus, or arsenic, is added is formed.

The transistor 160 in FIG. 8B includes a channel formation region in the single crystal silicon substrate 800, impurity regions 802 (also referred to as a source region and a drain region) provided so that the channel formation region is sandwiched therebetween, a gate insulating layer 805 over the channel formation region, and a gate electrode 806 provided over the gate insulating layer 805 so as to overlap with the channel formation region. The material, the number of stacked layers, the shape, and the like of the gate insulating layer 805 and the gate electrode 806 can be determined as appropriate in accordance with required specifications.

In addition, impurity regions 803 that are different from the impurity regions 802 and function as LDD regions or extension regions are provided between the impurity regions 802 and the channel formation region. Insulating films 807 serving as sidewalls are provided on side surfaces of the gate electrode 806. Owing to the insulating films 807, the LDD regions or the extension regions can be formed.

In addition, on the surfaces of the impurity regions 802, silicide regions 804 are provided in a region that does not overlap with the insulating film 807 serving as sidewalls. When the silicide regions 804 are formed, resistance of the source region and the drain region can be further lowered and the speed of the semiconductor device is increased. Further, the semiconductor device can be operated at low voltage; thus, power consumption of the semiconductor device can be reduced.

The transistor 160 is covered with an insulating film 809. The insulating film 809 can function as a protective film and can prevent impurities from entering the channel formation region from the outside. In addition, over the insulating film 809, an insulating film 810 whose surface is planarized by CMP treatment is provided.

Furthermore, an insulating film 812 and an insulating film 816 are stacked in this order over the insulating film 810. In the insulating film 812, a wiring layer 813a, a wiring layer 813b, and a conductive film 814 are embedded.

In the example of the structure illustrated in FIG. 8B, the capacitor 164 is a trench capacitor formed in the opening in the insulating film 816. With the trench capacitor, the storage capacitance per unit area of the capacitor 164 can be increased, and accordingly an area occupied by the memory device can be reduced.

The capacitor 164 includes a first electrode 817, an insulating film 818, and a second electrode 819. As the insulating film 818, an insulating film containing a high-k material such as aluminum oxide, hafnium oxide, tantalum oxide, zirconium oxide, lead zirconate titanate (PZT), strontium titanate ($SrTiO_3$), or (Ba, Sr)$TiO_3$ (BST) can be used. The insulating film may be a single layer or a stacked layer. The insulating film may contain oxide such as aluminum oxide, bismuth oxide, germanium oxide, niobium oxide, silicon oxide, titanium oxide, tungsten oxide, yttrium oxide, or zirconium oxide. A layer of silicon oxide, silicon oxynitride, or silicon nitride may be stacked over the insulating film.

Over the capacitor 164, an insulating film 820 whose surface is planarized by CMP treatment is further provided. Over the insulating film 822, an insulating film 821 having barrier properties against oxygen and hydrogen and an insulating film 822 containing oxygen are provided. For the insulating film 821 and the insulating film 822, the description of the barrier film 101 and the insulating film 102 in the above embodiment can be referred to.

The transistor 162 provided over the insulating film 822 is a vertical transistor, in which a first electrode 823, an oxide semiconductor layer 825, and a second electrode 826 are stacked in this order, a gate insulating layer 827 is provided in contact with side surfaces of the first electrode 823, the oxide semiconductor layer 825, and the second electrode 826, and a ring-shaped gate electrode 828 is provided to face the side surfaces of the first electrode 823, the oxide semiconductor layer 825, and the second electrode 826 with the gate insulating layer 827 interposed therebetween. The first electrode 823 has an opening, and the insulating layer 824 containing oxygen is embedded in the opening. For the details of the structure of the transistor 162, the above embodiment can be referred to; thus, the detailed description is skipped.

The first electrode 823 of the transistor 162 is connected to the first electrode 817 of the capacitor 164 through a contact plug 831.

Furthermore, an insulating film 829 having barrier properties against oxygen and hydrogen and an insulating film 830 whose surface is planarized are provided to cover the transistor 162. For the insulating film 829, description of the barrier film 109 in the above embodiment can be referred to.

In FIG. 8B, one of a source and a drain of the transistor 160 is connected to the wiring layer 813a through a contact plug 811a, and the other of the source and the drain is connected to the wiring layer 813b through a contact plug 811b. Here, the contact plugs 811a and 811b also function as source and drain electrodes of the transistor 160 to which the contact plugs 811a and 811b are connected. The gate electrode 806 of the transistor 160 is connected to the first electrode 817 of the capacitor 164 through a contact plug 811c and the conductive film 814.

The gate electrode 828 of the transistor 162 is connected to a wiring layer 833a through a contact plug 832a, and the second electrode 826 of the transistor 162 is connected to a wiring layer 833b through a contact plug 832b.

In the structure in FIG. 8B, the transistor 160, the capacitor 164, and the transistor 162 are stacked; thus, an area occupied by the semiconductor device can be made small.

Figure 9:
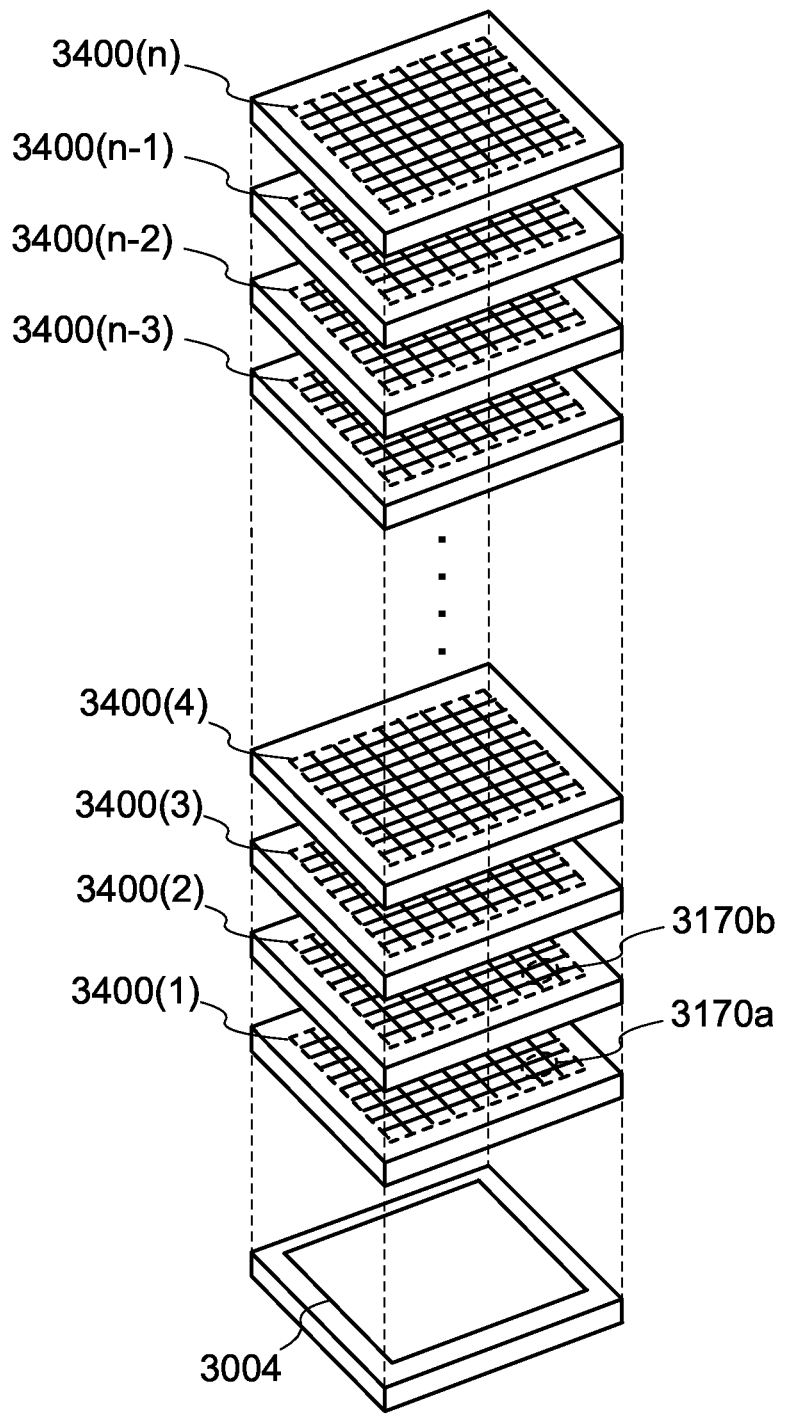
FIG. 9 is a perspective view illustrating one embodiment of a semiconductor device.

FIG. 9 illustrates an example of one embodiment of a structure of a memory device different from the above-described memory device.

FIG. 9 is a perspective view of a memory device. The memory device illustrated in FIG. 9 includes a plurality of layers of memory cell arrays (memory cell arrays 3400(1) to 3400(n) (n is an integer greater than or equal to 2)) each including a plurality of memory cells as memory circuits in an upper portion, and a logic circuit 3004 in a lower portion which is necessary for operating the memory cell arrays 3400(1) to 3400(n).

FIG. 9 illustrates the logic circuit 3004, the memory cell array 3400(1), and the memory cell array 3400(2), and illustrates a memory cell 3170a and a memory cell 3170b as typical examples among the plurality of memory cells included in the memory cell array 3400(1) and the memory cell array 3400(2). The memory cell 3170a and the memory cell 3170b can have a configuration similar to the circuit configuration described in this embodiment and illustrated in FIG. 8A, for example.

Note that as transistors included in the memory cells 3170a and 3170b, a transistor in which a channel formation region is formed in an oxide semiconductor film is used. The structure of the transistor in which the channel formation region is formed in the oxide semiconductor film is the same as the structure described in Embodiment 1 and Embodiment 2; thus, the description of the structure is omitted.

The logic circuit 3004 includes a transistor in which a semiconductor material other than an oxide semiconductor is used for a channel formation region. For example, a transistor obtained by providing an element isolation insulating layer on a substrate containing a semiconductor material (e.g., silicon) and forming a region serving as the channel formation region in a region surrounded by the element isolation insulating layer can be used. Note that the transistor may be a transistor obtained in such a manner that the channel formation region is formed in a semiconductor film such as a polycrystalline silicon film formed on an insulating surface or in a silicon film of an SOI substrate.

The memory cell arrays 3400(1) to 3400(n) and the logic circuit 3004 are stacked with interlayer insulating layers provided therebetween, and are electrically connected to each other as appropriate through electrodes and wirings which penetrate the interlayer insulating layers, for example.

When a transistor having a channel formation region formed using an oxide semiconductor and having extremely small amount of off-state current is applied to the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike in a conventional nonvolatile memory, it is not necessary to inject and extract electrons into and from a floating gate, and thus a problem such as deterioration of a gate insulating film does not arise. In other words, the semiconductor device according to one embodiment of the present invention does not have a limit on the number of times of writing which is a problem in the conventional nonvolatile memory, and the reliability thereof is drastically improved. Furthermore, data is written depending on the on state and the off state of the transistor, whereby high-speed operation can be easily achieved.

As described above, a miniaturized and highly-integrated semiconductor device having high electrical characteristics and a method for manufacturing the semiconductor device can be provided.

The structures, the methods, and the like described in this embodiment can be combined as appropriate with any of the structures, the methods, and the like described in the other embodiments.

(Embodiment 4)

In this embodiment, a central processing unit (CPU) at least part of which includes any of the transistors disclosed in Embodiment 1 or 2 will be described as an example of a semiconductor device.

Figure 10A:
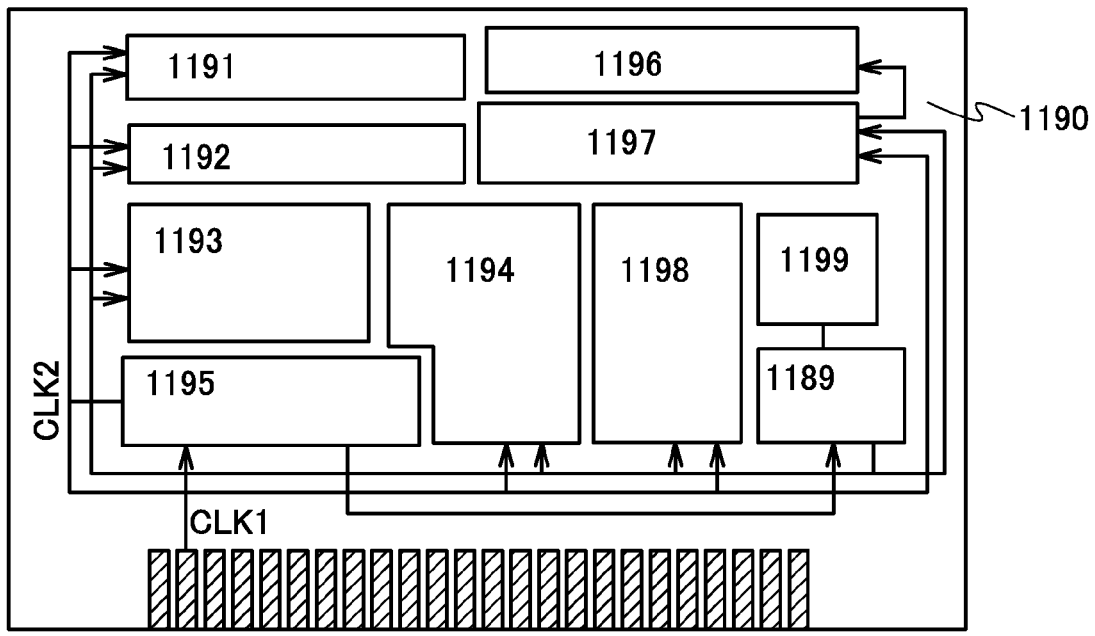
FIG. 10A is a block diagram illustrating one embodiment of a semiconductor device.

FIG. 10A is a block diagram illustrating a specific structure of a CPU. The CPU illustrated in FIG. 10A includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189. A semiconductor substrate, an SOI substrate, a glass substrate, or the like is used as the substrate 1190. The ROM 1199 and the ROM interface 1189 may each be provided over a separate chip. Obviously, the CPU illustrated in FIG. 10A is only an example in which the structure is simplified, and an actual CPU may have various structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 10A, a memory cell is provided in the register 1196. The memory cell disclosed in Embodiment 3 can be used as the memory cell in the register 1196.

In the CPU illustrated in FIG. 10A, the register controller 1197 selects operation of holding data in the register 1196 in accordance with an instruction from the ALU 1191. That is, the register controller 1197 determines whether data is held by a logic element reversing the logic (value) or by a capacitor in the memory cell included in the register 1196. When data holding by the phase-inversion element is selected, power supply voltage is supplied to the memory cell in the register 1196. When data holding by the capacitor is selected, the data is rewritten in the capacitor, and supply of power supply voltage to the memory cell in the register 1196 can be stopped.

Figure 10B:
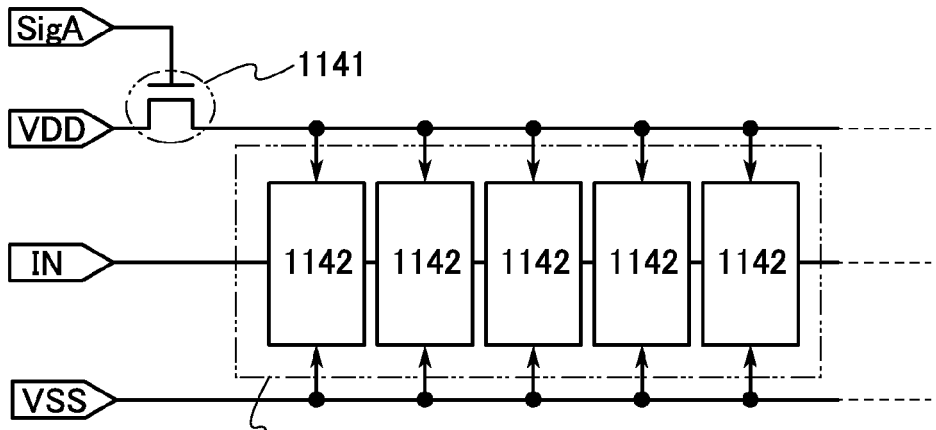
FIGS. 10B and 10C are circuit diagrams.
Figure 10C:
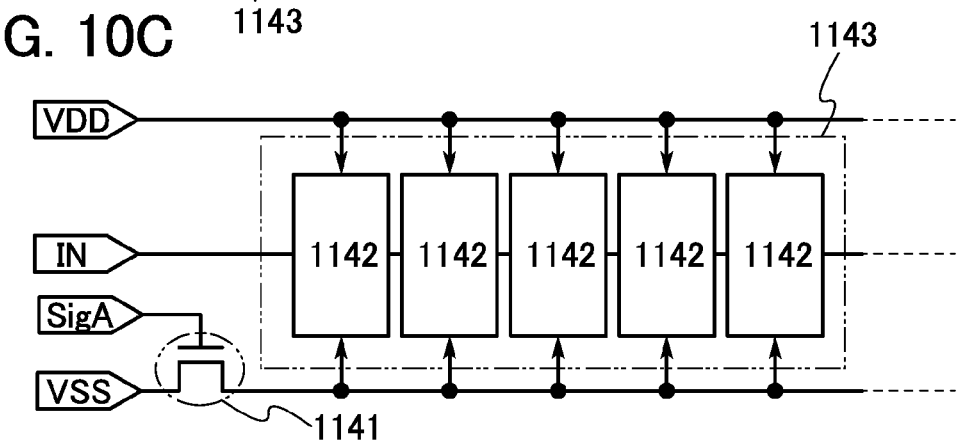

The power supply can be stopped by providing a switching element between a memory cell group and a node to which a power supply potential VDD or a power supply potential VSS is supplied, as illustrated in FIG. 10B or FIG. 10C. Circuits illustrated in FIGS. 10B and 10C are described below.

FIGS. 10B and 10C each illustrate an example of a structure of a memory circuit in which the transistor disclosed in Embodiment 1 is used as a switching element for controlling supply of a power supply potential to a memory cell.

The memory device illustrated in FIG. 10B includes a switching element 1141 and a memory cell group 1143 including a plurality of memory cells 1142. Specifically, as each of the memory cells 1142, the memory cell described in Embodiment 3 can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

As the switching element 1141 in FIG. 10B, any of the transistors described in Embodiment 1 is used. The switching of the transistor is controlled by a signal SigA supplied to the gate electrode thereof.

Note that FIG. 10B illustrates the configuration in which the switching element 1141 includes only one transistor; however, one embodiment of the present invention is not limited thereto, and the switching element 1141 may include a plurality of transistors. In the case where the switching element 1141 includes a plurality of transistors which serves as switching elements, the plurality of transistors may be connected to each other in parallel, in series, or in combination of parallel connection and serial connection.

Although the switching element 1141 controls the supply of the high-level power supply potential VDD to each of the memory cells 1142 included in the memory cell group 1143 in FIG. 10B, the switching element 1141 may control the supply of the low-level power supply potential VSS.

In FIG. 10C, an example of a memory device in which each of the memory cells 1142 included in the memory cell group 1143 is supplied with the low-level power supply potential VSS through the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be used for an LSI such as a digital signal processor (DSP), a custom LSI, or a field programmable gate array (FPGA).

The structures, the methods, and the like described in this embodiment can be combined as appropriate with any of the structures, the methods, and the like described in the other embodiments.

(Embodiment 5)

A structure example of a display device according to one embodiment of the present invention will be described.

<Structure Example>

Figure 14A:
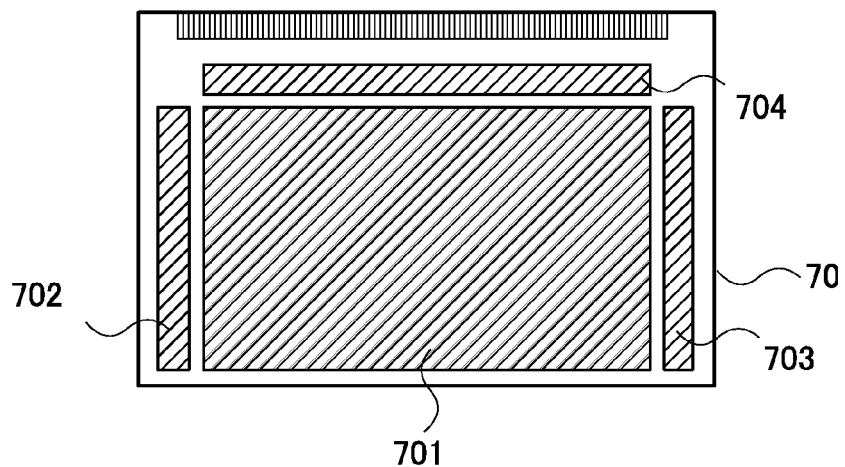
FIGS. 14A to 14C are a top view and circuit diagrams showing a structural example of a display device according to one embodiment.
Figure 14B:
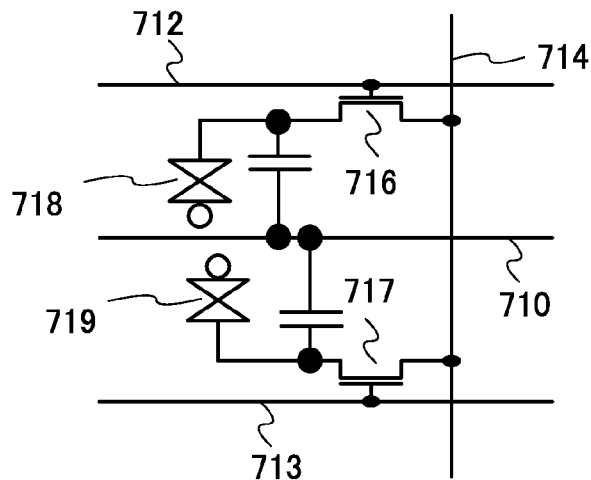
Figure 14C:
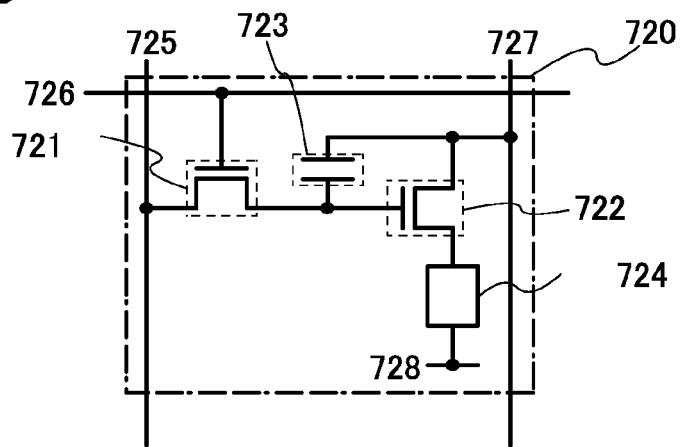

FIG. 14A is a top view of a display device of one embodiment of the present invention. FIG. 14B is a circuit diagram for illustrating a pixel circuit that can be used in the case where a liquid crystal element is used in a pixel in the display device of one embodiment of the present invention. FIG. 14C is a circuit diagram for illustrating a pixel circuit that can be used in the case where an organic EL element is used in a pixel in the display device of one embodiment of the present invention.

The transistor in the pixel portion can be formed in accordance with the above embodiment. Further, the transistor can easily be an n-channel transistor, and thus, part of a driver circuit that can be formed using an n-channel transistor in the driver circuit is formed over the same substrate as the transistor of the pixel portion. With use of the transistor described in the above embodiment for the pixel portion or the driver circuit in this manner, a highly reliable display device can be provided.

FIG. 14A illustrates an example of a top view of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 is arranged and a plurality of scan lines extended from the first scan line driver circuit 702 and the second scan line driver circuit 703 is arranged. Note that pixels each including a display element are provided in matrix in respective regions in each of which the scan line and the signal line intersect with each other. The substrate 700 of the display device is connected to a timing control circuit (also referred to as a controller or a controller IC) through a connection portion such as a flexible printed circuit (FPC).

In FIG. 14A, the first scan line driver circuit 702, the second scan line driver circuit 703, and the signal line driver circuit 704 are formed over the same substrate 700 as the pixel portion 701. Accordingly, the number of components which is provided outside, such as a driver circuit, are reduced, so that a reduction in cost can be achieved. Further, if the driver circuit is provided outside the substrate 700, wirings would need to be extended and the number of connections of wirings would be increased, but by providing the driver circuit over the substrate 700, the number of connections of the wirings can be reduced. Consequently, an improvement in reliability or yield can be achieved.

<Liquid Crystal Display Device>

FIG. 14B illustrates an example of a circuit configuration of the pixel. Here, a pixel circuit which is applicable to a pixel of a VA liquid crystal display device is illustrated as an example.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a source or drain electrode layer 714 that functions as a data line is shared by the transistors 716 and 717. The transistor described in the above embodiments can be used as appropriate as each of the transistors 716 and 717. Thus, a highly reliable liquid crystal display device can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer has a V shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Further, a storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 14B. For example, a switch, a resistor, a capacitor, a transistor, a sensor, a logic circuit, or the like may be added to the pixel illustrated in FIG. 14B.

<Organic EL Display Device>

FIG. 14C illustrates another example of a circuit configuration of the pixel. Here, a pixel structure of a display device using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Based on such a mechanism, such a light-emitting element is referred to as a current-excitation type light-emitting element.

FIG. 14C illustrates an applicable example of a pixel circuit. In this example, one pixel includes two n-channel transistors. Note that the metal oxide film of one embodiment of the present invention can be used for channel formation regions of the n-channel transistors. Further, digital time grayscale driving can be employed for the pixel circuit.

The configuration of the applicable pixel circuit and operation of a pixel employing digital time grayscale driving will be described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line provided over the same substrate.

As the switching transistor 721 and the driver transistor 722, the transistor described in any of the above embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage $V_{th}$ of the driver transistor 722 is applied to the signal line 725.

In the case of performing analog grayscale driving, a voltage higher than or equal to a voltage which is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 14C. For example, a switch, a resistor, a capacitor, a sensor, a transistor, a logic circuit, or the like may be added to the pixel circuit illustrated in FIG. 14C.

In the case where any of the transistors described in the above embodiments is used for the circuit shown in FIGS. 14A to 14C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

In this specification and the like, for example, a display element, a display device which is a device including a display element, a light-emitting element, and a light-emitting device which is a device including a light-emitting element can employ a variety of modes or can include a variety of elements. Examples of a display element, a display device, a light-emitting element, or a light-emitting device include an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), MIRASOL (registered trademark), an interferometric modulator display (IMOD) element, an electrowetting element, a piezoelectric ceramic display, or a carbon nanotube, which are display media whose contrast, luminance, reflectivity, transmittance, or the like is changed by electromagnetic action. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper.

At least part of this embodiment can be implemented in combination with any of the embodiments described in this specification as appropriate.

(Embodiment 6)

The semiconductor device disclosed in this specification can be used for a variety of electronic devices (including game machines). Examples of the electronic devices include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. In addition, moving objects and the like driven by oil engines and electric motors using power from the non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic devices are illustrated in FIGS. 11A to 11C, FIGS. 12A to 12C, and FIGS. 13A to 13C.

Figure 11A:
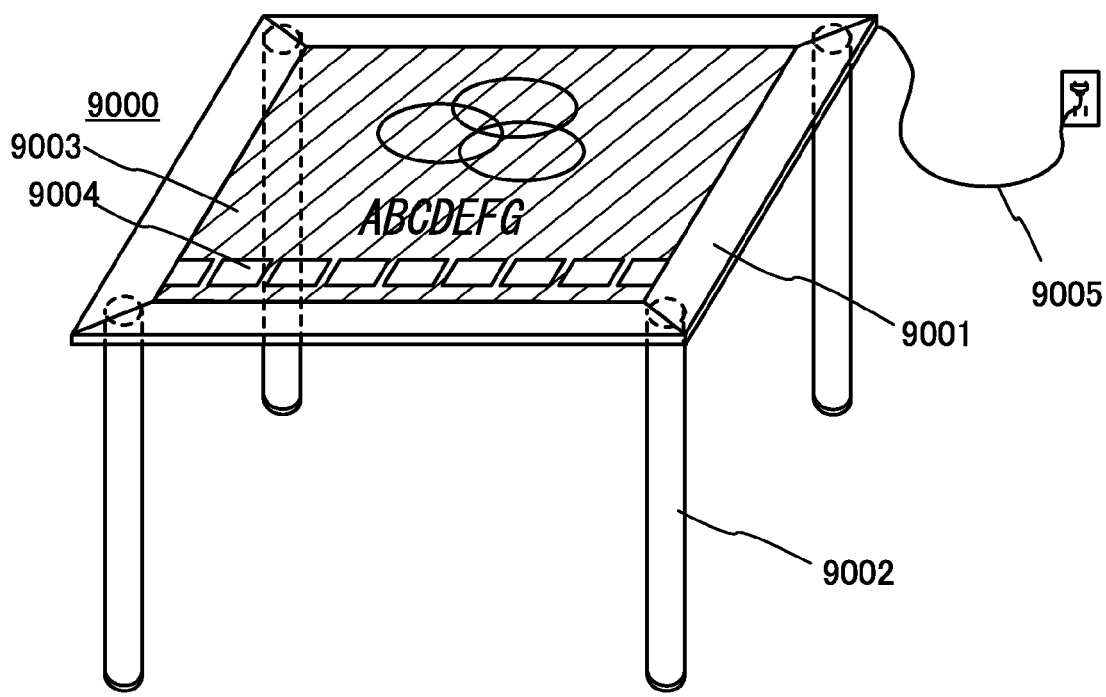
FIGS. 11A to 11C each illustrate an electronic device.

FIG. 11A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The transistor described in Embodiment 1 can be used in the display portion 9003 so that the electronic device can have high reliability.

The display portion 9003 has a touch-input function. When a user touches displayed buttons 9004 which are displayed on the display portion 9003 of the table 9000 with his/her finger or the like, the user can carry out operation of the screen and input of data. Further, when the table may be made to communicate with home appliances or control the home appliances, the table 9000 may function as a control device which controls the home appliances by operation on the screen. For example, with use of a semiconductor device having an image sensor function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

Figure 11B:
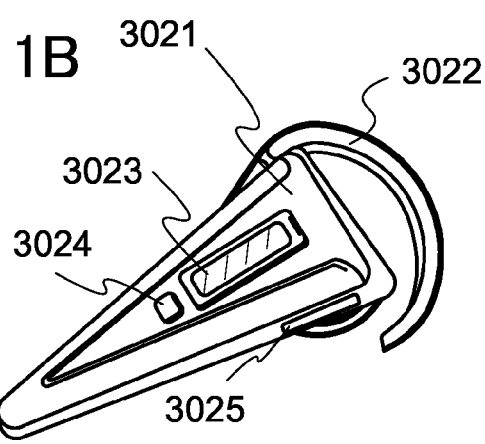

FIG. 11B illustrates a portable music player, which includes, in a main body 3021, a display portion 3023, a fixing portion 3022 with which the main body is worn on the ear, a speaker, an operation button 3024, an external memory slot 3025, and the like. The transistor, the memory, or the integrated circuit which are described in any of Embodiments 1 to 4 is used in a memory or a CPU incorporated in the main body 3021, whereby a portable music player (PDA) in which power consumption can be further reduced can be provided.

Further, when the portable music player illustrated in FIG. 11B has an antenna, a microphone function, or a wireless communication function and is used with a mobile phone, a user can talk on the phone wirelessly in a hands-free way while driving a car or the like.

Figure 11C:
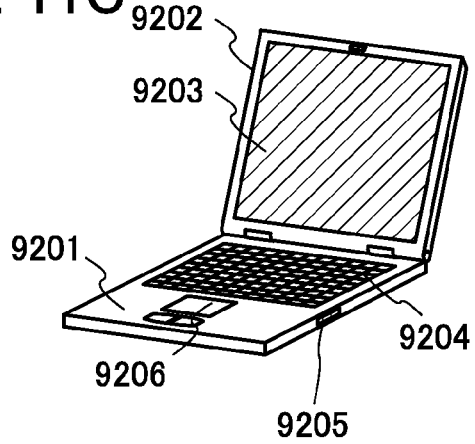

FIG. 11C illustrates a computer which includes a main body 9201 including a CPU, a housing 9202, a display portion 9203, a keyboard 9204, an external connection port 9205, a pointing device 9206, and the like. The computer includes a semiconductor device manufactured according to one embodiment of the present invention for the display portion 9203. When the CPU described in Embodiment 4 is used, power consumption of the computer can be reduced.

Figure 12A:
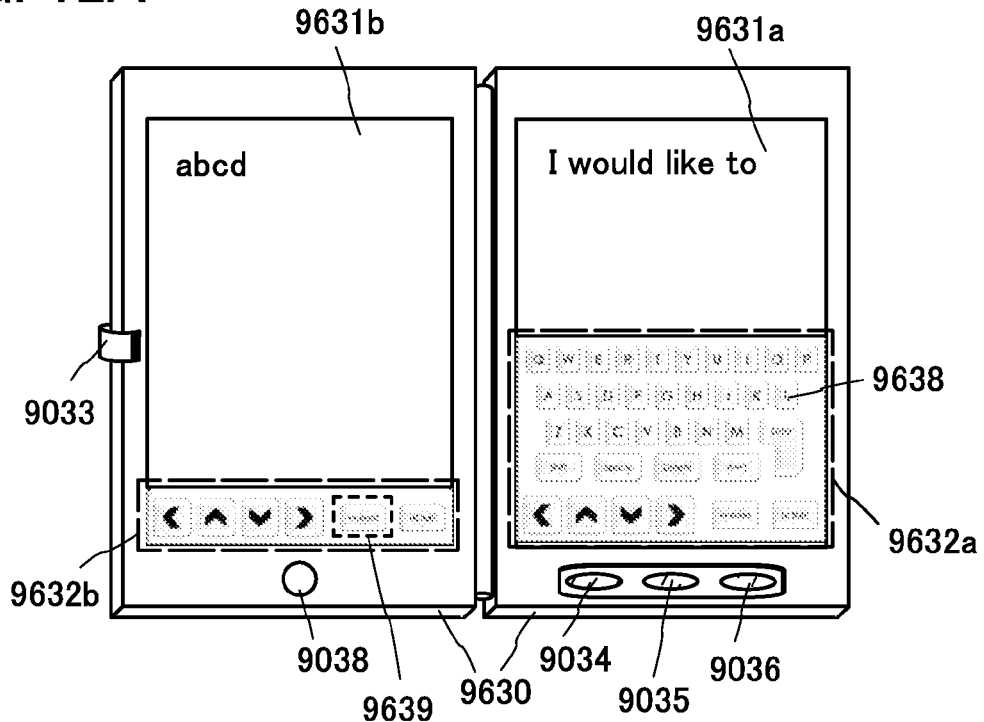
FIGS. 12A to 12C illustrate an electronic device.
Figure 12B:
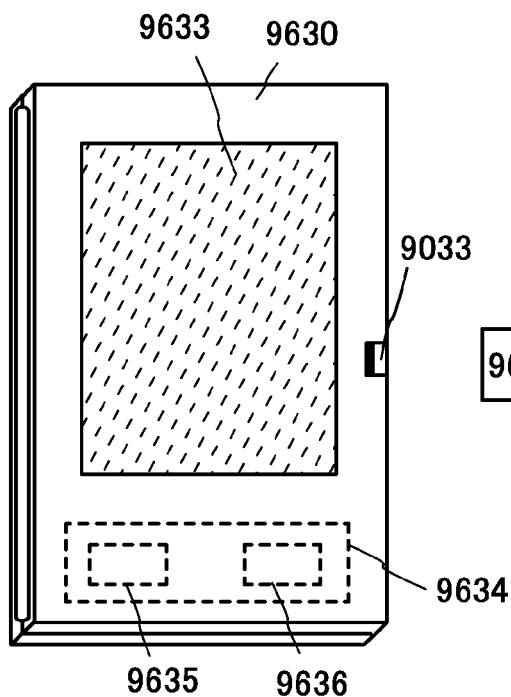

FIGS. 12A and 12B illustrate a tablet terminal that can be folded. The tablet terminal is opened in FIG. 12A. The tablet terminal includes a housing 9630, a display portion 9631a, a display portion 9631b, a display-mode switching button 9034, a power switch 9035, a power saver switch 9036, a clasp 9033, and an operation switch 9038.

In such a portable device illustrated in FIGS. 12A and 12B, an SRAM or a DRAM is used as a memory for temporarily storing image data. For example, the semiconductor device described in Embodiment 3 can be used as the memory. By employing any of the semiconductor devices described in the above embodiments for the memory, data can be written and read at high speed and held for a long time, and power consumption can be sufficiently reduced.

A touch panel region 9632a can be provided in a part of the display portion 9631a, in which data can be input by touching displayed operation keys 9638. Note that FIG. 12A shows, as an example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

As in the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed in the touch panel region 9632a and the touch panel region 9632b at the same time.

The display-mode switching button 9034 allows switching between a landscape mode and a portrait mode, color display and black-and-white display, and the like. The power saver switch 9036 can control display luminance in accordance with the amount of external light in use of the tablet terminal detected by an optical sensor incorporated in the tablet terminal. In addition to the optical sensor, other detecting devices such as sensors for determining inclination, such as a gyroscope or an acceleration sensor, may be incorporated in the tablet terminal.

Although the display portion 9631a and the display portion 9631b have the same display area in FIG. 12A, one embodiment of the present invention is not limited to this structure. The display portion 9631a and the display portion 9631b may have different areas or different display quality. For example, one of the display portions 9631a and 9631b may display higher definition images than the other.

The tablet terminal is closed in FIG. 12B. The tablet terminal includes the housing 9630, a solar cell 9633, a charge and discharge control circuit 9634, a battery 9635, and a DCDC converter 9636. In FIG. 12B, a structure including the battery 9635 and the DCDC converter 9636 is illustrated as an example of the charge and discharge control circuit 9634.

Since the tablet terminal is foldable, the housing 9630 can be closed when the tablet terminal is not used. As a result, the display portion 9631a and the display portion 9631b can be protected; thus, a tablet terminal which has excellent durability and excellent reliability in terms of long-term use can be provided.

The tablet terminal illustrated in FIGS. 12A and 12B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633, which is attached on the surface of the tablet terminal, supplies electric power to a touch panel, a display portion, an image signal processor, and the like. Note that the solar cell 9633 can be provided on one or both surfaces of the housing 9630, and the battery 9635 can be charged efficiently. When a lithium ion battery is used as the battery 9635, there is an advantage of downsizing or the like.

Figure 12C:
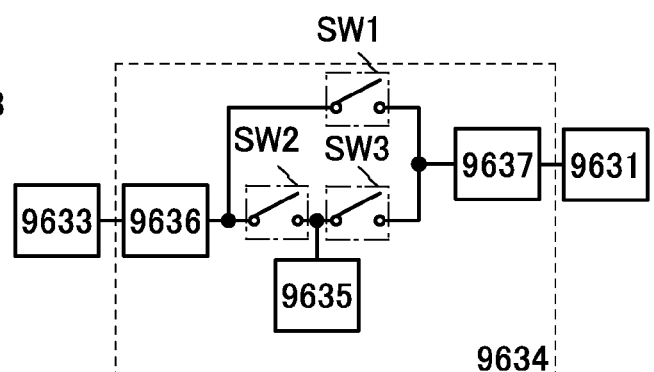

The structure and operation of the charge/discharge control circuit 9634 illustrated in FIG. 12B are described with reference to a block diagram of FIG. 12C. FIG. 12C illustrates the solar cell 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge/discharge control circuit 9634 in FIG. 12B.

First, an example of operation in the case where power is generated by the solar cell 9633 using external light is described. The voltage of power generated by the solar cell 9633 is raised or lowered by the DCDC converter 9636 to a voltage for charging the battery 9635. When the display portion 9631 is operated with the power from the solar cell 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar cell 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module capable of performing charging by transmitting and receiving electric power wirelessly (without contact), or any of the other charge means used in combination.

Figure 13A:
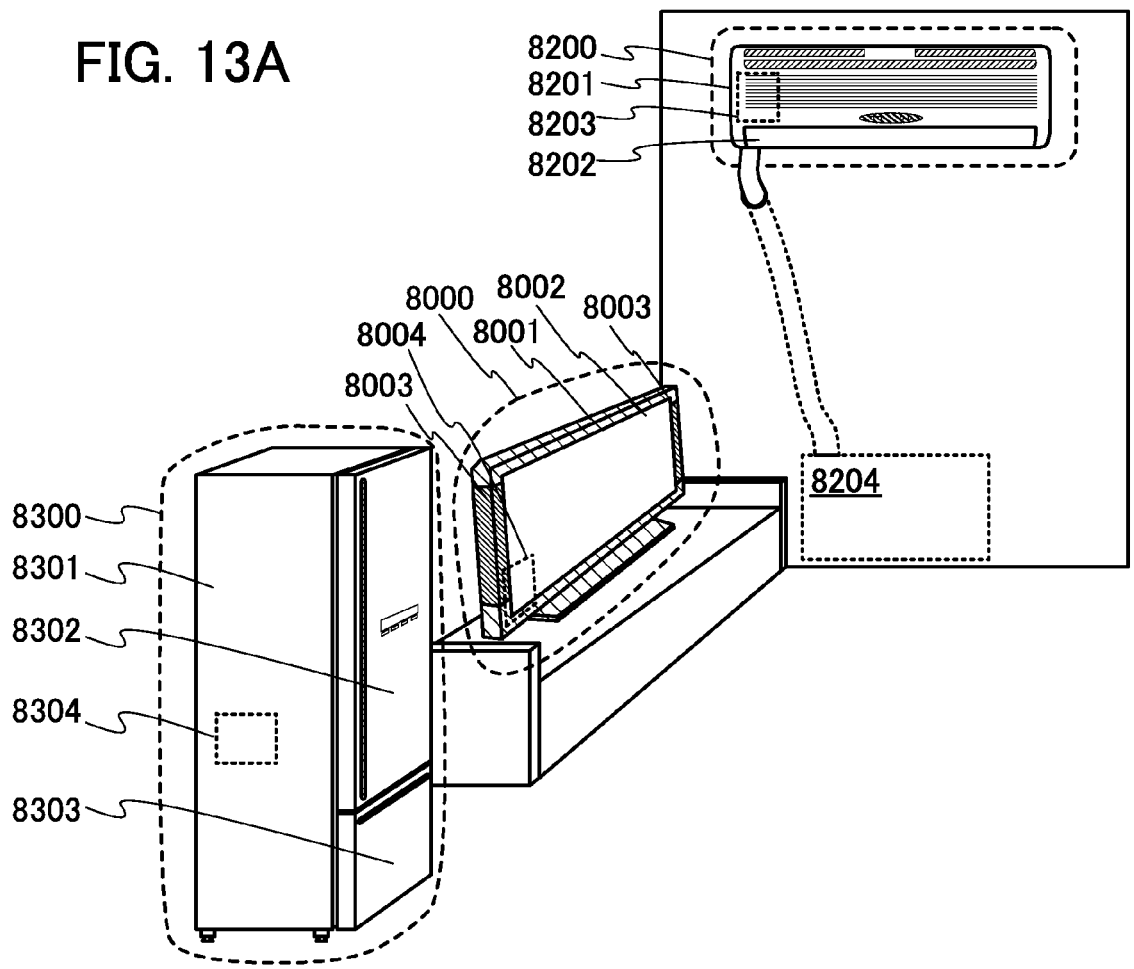
FIGS. 13A to 13C illustrate electronic devices.

In a television device 8000 in FIG. 13A, a display portion 8002 is incorporated in a housing 8001. The display portion 8002 displays an image and a speaker portion 8003 can output sound. The transistor described in Embodiment 1 can be used for the display portion 8002.

A semiconductor display device such as a liquid crystal display device, a light-emitting device in which a light-emitting element such as an organic EL element is provided in each pixel, an electrophoresis display device, a digital micromirror device (DMD), or a plasma display panel (PDP) can be used for the display portion 8002.

The television device 8000 may be provided with a receiver, a modem, and the like. Furthermore, when the television device 8000 that can receive general television broadcasting is connected to a communication network by wired or wireless connection via the modem, one-way (from a transmitter to a receiver) or two-way (between a transmitter and a receiver, between receivers, or the like) data communication can be performed.

In addition, the television device 8000 may include a CPU for performing information communication or a memory. The integrated circuit, the memory, or the CPU described in any of Embodiment 2 to 4 can be used for the television device 8000.

In FIG. 13A, an air conditioner which includes an indoor unit 8200 and an outdoor unit 8204 is an example of an electrical appliance in which the CPU of Embodiment 4 is used. Specifically, the indoor unit 8200 includes a housing 8201, an air outlet 8202, a CPU 8203, and the like. FIG. 13A shows the case where the CPU 8203 is provided in the indoor unit 8200; the CPU 8203 may be provided in the outdoor unit 8204. Alternatively, the CPU 8203 may be provided in both the indoor unit 8200 and the outdoor unit 8204. Since the CPU described in Embodiment 4 is a CPU in which an oxide semiconductor is used, an air conditioner having excellent heat resistance property and high reliability can be provided with use of the CPU.

In FIG. 13A, an electric refrigerator-freezer 8300 is an example of an electrical appliance which is provided with the CPU using an oxide semiconductor. Specifically, the electric refrigerator-freezer 8300 includes a housing 8301, a door for a refrigerator 8302, a door for a freezer 8303, a CPU 8304, and the like. In FIG. 13A, the CPU 8304 is provided in the housing 8301. When the CPU described in Embodiment 4 is used as the CPU 8304 of the electric refrigerator-freezer 8300, power saving can be achieved.

Figure 13B:
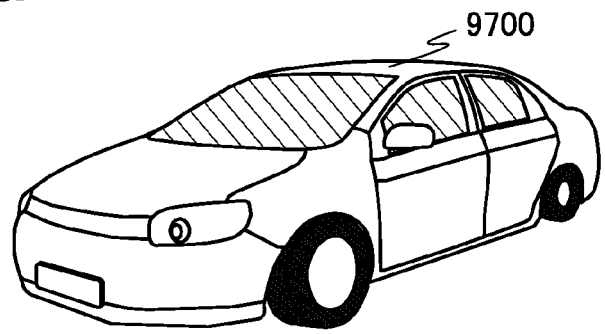
Figure 13C:
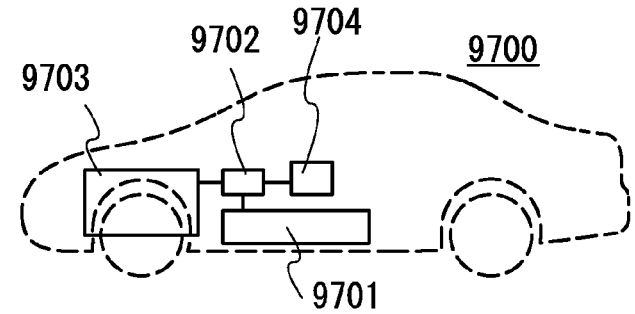

FIGS. 13B and 13C illustrate an example of an electric vehicle which is an example of an electrical appliance. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When the CPU described in Embodiment 4 is used as the CPU in the electric vehicle 9700, power saving can be achieved.

The driving device 9703 includes a DC motor or an AC motor either alone or in combination with an internal-combustion engine. The processing unit 9704 outputs a control signal to the control circuit 9702 on the basis of input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

The structures, the methods, and the like described in this embodiment can be combined as appropriate with any of the structures, the methods, and the like described in the other embodiments.

This application is based on Japanese Patent Application serial no. 2013-193292 filed with Japan Patent Office on Sep. 18, 2013, the entire contents of which are hereby incorporated by reference.

What is claimed is:

1. A semiconductor device comprising:
    a first electrode;
    an oxide semiconductor layer over the first electrode;
    a second electrode overlapping with the first electrode with the oxide semiconductor layer interposed therebetween;
    a gate insulating layer in contact with the first electrode, the oxide semiconductor layer, and the second electrode; and
    a gate electrode facing a side surface of the oxide semiconductor layer with the gate insulating layer interposed therebetween,
    wherein the first electrode has an opening through which the oxide semiconductor layer is exposed,
    wherein an insulating layer which is in contact with the oxide semiconductor layer is embedded in the opening,
    wherein an upper surface of the insulating layer is aligned with an upper surface of the first electrode,
    wherein the insulating layer is in contact with a side surface of the opening,
        wherein the first electrode functions as one of a source electrode and a drain electrode, and
        wherein the second electrode functions as the other of the source electrode and the drain electrode, and
        wherein a top surface of the gate electrode, a top surface of the gate insulating layer, and a top surface of the second electrode are coplanar.

2. The semiconductor device according to claim 1, wherein the insulating layer contains oxygen.

3. The semiconductor device according to claim 2, wherein the insulating layer entirely fills the opening, Fig. 1A.

4. The semiconductor device according to claim 2, wherein the insulating layer contains oxygen in excess of stoichiometric composition.

5. An electronic device comprising the semiconductor device according to claim 1.

6. The semiconductor device according to claim 1, wherein the first electrode, the second electrode, the gate electrode and the oxide semiconductor form a transistor.

7. The semiconductor device according to claim 1, wherein a region of the gate electrode facing the oxide semiconductor layer is formed substantially orthogonal to a top surface of the oxide semiconductor layer.

8. The semiconductor device according to claim 1, wherein a shape of the gate electrode is a ring.

9. The semiconductor device according to claim 1, wherein a shape of the first electrode is a ring.

10. A semiconductor device comprising:
    a first electrode having a first opening;
    a first insulating layer embedded in the first opening;
    an oxide semiconductor layer that is over the first electrode and in contact with the first insulating layer;
    a second electrode overlapping with the first electrode with the oxide semiconductor layer interposed therebetween;
    a second insulating layer over the second electrode;
    a gate insulating layer in contact with the first electrode, the oxide semiconductor layer, the second electrode, and the second insulating layer; and
    a gate electrode facing a side surface of the oxide semiconductor layer with the gate insulating layer interposed therebetween,
    wherein an upper surface of the first insulating layer is aligned with an upper surface of the first electrode,
    wherein the first insulating layer is in contact with a side surface of the first opening,
    wherein the first electrode functions as one of a source electrode and a drain electrode, and
    wherein the second electrode functions as the other of the source electrode and the drain electrode, and
    wherein a top surface of the gate electrode, a top surface of the gate insulating layer, and a top surface of the second electrode are coplanar.

11. The semiconductor device according to claim 10, wherein the first insulating layer contains oxygen.

12. The semiconductor device according to claim 11, wherein the first insulating layer contains oxygen in excess of stoichiometric composition.

13. The semiconductor device according to claim 10,
    wherein the second electrode has a second opening, and
    wherein the second insulating layer is in contact with the oxide semiconductor layer in the second opening.

14. The semiconductor device according to claim 13, wherein the second insulating layer contains oxygen.

15. The semiconductor device according to claim 13,
    wherein the second insulating layer is in contact with a side surface of the second opening.

16. An electronic device comprising the semiconductor device according to claim 10.

17. The semiconductor device according to claim 10, wherein the first insulating layer entirely fills the first opening.

18. The semiconductor device according to claim 10, wherein the first electrode, the second electrode, the gate electrode and the oxide semiconductor form a transistor.

19. The semiconductor device according to claim 10, wherein a region of the gate electrode facing the oxide semiconductor layer is formed substantially orthogonal to a top surface of the oxide semiconductor layer.

20. The semiconductor device according to claim 10, wherein a shape of the gate electrode is a ring.

21. The semiconductor device according to claim 10, wherein a shape of the first electrode is a ring.

22. A semiconductor device comprising a transistor, the transistor comprising:
    a first electrode;
    an insulating layer,
    an oxide semiconductor layer;
    a second electrode;
    a gate electrode; and
    a gate insulating layer,
    wherein the oxide semiconductor layer is on and in electric contact with the first electrode,
    wherein the oxide semiconductor layer is on and in direct contact with the insulating layer,
    wherein the second electrode is on and in electric contact with the oxide semiconductor layer,
    wherein each of the first electrode and the insulating layer overlaps with the second electrode with the oxide semiconductor layer interposed therebetween,
    wherein the first electrode surrounds the insulating layer when seen from the above,
    wherein an inner side surface of the first electrode is in contact with a side surface of the insulating layer, and
    wherein a top surface of the gate electrode, a top surface of the gate insulating layer, and a top surface of the second electrode are coplanar.

23. The semiconductor device according to claim 22, wherein the insulating layer contains oxygen.

24. The semiconductor device according to claim 22, wherein a shape of the first electrode is a ring when seen from the above.

25. The semiconductor device according to claim 22, wherein a shape of the gate electrode is a ring when seen from the above.

* * * * *